United States Patent
Takeda

(10) Patent No.: US 7,826,253 B2
(45) Date of Patent: Nov. 2, 2010

(54) SEMICONDUCTOR MEMORY DEVICE AND DRIVING METHOD THEREOF

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 722 days.

(21) Appl. No.: 11/815,415

(22) PCT Filed: Feb. 3, 2006

(86) PCT No.: PCT/JP2006/302304

§ 371 (c)(1),
(2), (4) Date: Aug. 2, 2007

(87) PCT Pub. No.: WO2006/083034

PCT Pub. Date: Aug. 10, 2006

(65) Prior Publication Data

US 2009/0027947 A1 Jan. 29, 2009

(30) Foreign Application Priority Data

Feb. 3, 2005 (JP) ............................. 2005-027263

(51) Int. Cl.
*G11C 11/00* (2006.01)
(52) U.S. Cl. ............................. 365/156; 365/189.011; 365/189.14
(58) Field of Classification Search ................. 365/156, 365/189.011, 189.14
See application file for complete search history.

(56) References Cited

U.S. PATENT DOCUMENTS 5,648,930 A * 7/1997 Randazzo .............. 365/185.07

FOREIGN PATENT DOCUMENTS

| JP | 57-20992 A | 2/1982 |
|---|---|---|
| JP | 4-366493 A | 12/1992 |
| JP | 7-50094 A | 2/1995 |
| JP | 9-45081 A | 2/1997 |
| JP | 11-353880 A | 12/1999 |
| WO | WO 2005/041203 A1 | 5/2005 |

OTHER PUBLICATIONS

Bhavnagarwala, et al., "The Impact of Intrinsic Device Fluctuations on CMOS SRAM Cell Stability", IEEE Journal of Solid-State Circuits, Apr. 2001, pp. 658-665, vol. 36, No. 4, IEEE.
Sakakibara, et al., "A 750MHz 144Mb Cache DRAM LSI with Speed Scalable Design and Programmable at-Speed Function-Array BIST", 2003 IEEE International Solid-State Circuits Conference/Session 26/Embedded and Digital Systems/Paper 26.1, 2003, IEEE.
Yamaoka, et al., "A 300MHz 25 µA/Mb Leakage On-Chip SRAM Module Featuring Process-Variation Immunity and Low-Leakage-Active Mode for Mobile-Phone Application Processor", 2004 IEEE International Solid-State Circuits Conference/Session 27/SRAM/27. 2, 2004, IEEE.

* cited by examiner

*Primary Examiner*—Son Dinh
*Assistant Examiner*—Nam Nguyen
(74) *Attorney, Agent, or Firm*—Sughrue Mion, PLLC

(57) ABSTRACT

In a reading operation, an off time and a reading time of a holding control transistor is controlled by a replica circuit, so that a read margin is enlarged. Furthermore, a high power source potential and a low power source potential of an SRAM memory cell are switched in reading and writing operations of the memory cell and in a data holding state by a power source potential switching portion. As a result, a write margin is enlarged, and a leakage current is reduced.

34 Claims, 26 Drawing Sheets

Ioff_N4 + Ioff_N5 >> Ioff_P2

Ioff_N4 + Ioff_N5 < Ioff_P2

SEMICONDUCTOR MEMORY DEVICE AND DRIVING METHOD THEREOF

TECHNICAL FIELD

The present invention relates to a semiconductor memory device, and more particularly to a semiconductor memory device capable of operating at an ultrahigh speed and an ultralow voltage with a memory cell formed by seven transistors and a driving method thereof.

BACKGROUND ART

Recent semiconductor devices have not only been scaled up and speeded up, but also been systematized by incorporating many functions. In order to scale up and speed up semiconductor devices, transistors have been made finer, and operating speeds have been improved while power source voltages have been reduced. Various types of function blocks including CPUs and various types of memory devices are combined with each other for systematization. Those memory devices jointly mounted on system LSIs are similarly required to operate at a high speed and a low power source voltage. For example, a static random access memory (hereinafter abbreviated as an SRAM), which is jointly mounted for applications of a cache memory and the like, is similarly required to operate at a high speed and a low power source voltage.

A conventional SRAM will be described with reference to FIGS. 1 to 4. FIG. 1 shows a conventional SRAM memory cell (hereinafter referred to as an SRAM cell) formed by six transistors. When a word line WL has a low potential, data can be held stably by forming a loop with two CMOS (Complementary Metal Oxide Semiconductor) inverters. Specifically, one of the CMOS inverters uses a storage node V1 as an input and outputs inverse data of data stored in the storage node V1 to a storage node V2. The other of the CMOS inverters uses the storage node V2 as an input and outputs inverse data of data stored in the storage node V2 to the storage node V1.

When the word line WL is accessed and brought into a high potential, access transistors N3 and N4 are brought into conduction so as to read data stored in the storage nodes V1 and V2 into bit lines BLT and BLN, thereby performing a reading operation of the memory. Conversely, data from the bit lines BLT and BLN are written into the storage nodes V1 and V2, thereby performing a writing operation of the memory.

However, in a conventional SRAM cell, a problem of corruption of stored data also arises when a reading operation is performed at a low power source voltage. The corruption of stored data in the reading operation will be described below.

When the word line WL is brought into a high level, the access transistors N3 and N4 are brought into conduction. Accordingly, the storage nodes V1 and V2 are connected to the bit lines BLT and BLN, respectively, and are to be changed into a bit line level. For example, when a low level is stored on the storage node V1, the potential of the storage node V1 is slightly increased by the bit line BLT. However, because a drive transistor N1 is in an on state, it lowers the potential of the storage node V1. If the increased potential of the storage node V1 exceeds a threshold level of a drive transistor N2 on an opposite side, the drive transistor N2 is turned on, thereby lowering a level of the storage node V2. Thus, an on-state current of the drive transistor N1 is reduced so that the potential of the storage node V1 is further increased. As a result, corruption of the stored data is caused.

Generally, a static noise margin (hereinafter abbreviated as an SNM) is used as an index for measuring the stability of holding accessed data in an SRAM cell.

As shown in FIG. 2, an SRAM cell is separated into two inverters, and DC (direct current) characteristics are calculated for each inverter. When those two DC characteristics are superimposed so that a DC characteristic output of one of the inverters serves as a DC characteristic input of the other inverter, a butterfly curve is drawn. An SNM is defined as one side of a maximum square inscribed in this butterfly curve. When an SNM exceeds 0 mV, a normal reading operation is performed. When an SNM is 0 mV or less, stored data are overwritten with inverse data and thus corrupted in a reading operation.

Predictions for the future of the SNM have been made in A. J. Bhavnagarwala's "The impact of intrinsic device fluctuations on CMOS SRAM cell stability", IEEE Journal of Solid State Circuit, Vol. 36, No. 4, April 2001 (FIGS. 5 and 10) (Non-patent Document 1). Specifically, when channel lengths of transistors used are made shorter so that they are shifted from 250 nm to 50 nm as shown in FIG. 3, an average of the SNMs is decreased, and a deviation of the SNMs is simultaneously increased. Accordingly, the worst value of the SNMs is considerably lowered. The worst value of the SNMs becomes below "0" in the illustrated example of 50 nm. Accordingly, stored data are corrupted when the word line WL is brought into a high potential in a reading operation.

Meanwhile, H. Sakakibara's "A 750 MHz 144 Mb cache DRAM LSI with speed scalable design and programmable at speed function-array BIST", IEEE International Solid State Circuit Conference, 2003 (FIG. 1) (Non-patent Document 2) discloses an SRAM cell formed by eight transistors as shown in FIG. 4 in which a read-only port is added to an SRAM cell formed by six transistors. With this configuration, corruption of stored data is not caused in a reading operation. However, this SRAM cell has problems in that the number of the transistors becomes eight and that a cell area is increased because of an increased number of signal lines.

DISCLOSURE OF INVENTION

Problems to be Solved by the Invention

As described above, the conventional SRAM cell formed by six transistors has a problem that the SRAM cell does not operate stably because the SNMs thereof are reduced when it is made finer and configured to operate at a lower voltage. Furthermore, although corruption of stored data in a reading operation is not caused in the SRA [sic] cell disclosed by Non-patent Document 2, the SRAM cell has problems in that a cell area is increased because the number of transistors is eight and that the number of signal lines is increased.

The present invention has been made in order to improve the aforementioned problems. Therefore, the present invention intends to implement a memory cell capable of preventing corruption of stored data in a reading operation with a minimum number of transistors, improve a stable operation against data corruption in a reading operation, reduce a leakage current, and enlarge an operation margin in a writing operation.

It is an object of the present invention to provide a memory cell capable of operation at an ultrahigh speed or at an ultralow voltage without stored data being corrupted in a reading operation and with stability and a reduced leakage current, and a semiconductor memory device having such a memory cell.

Means for Solving the Problems

A semiconductor memory device according to a first aspect of the present invention includes a memory cell. The memory cell has first and second inverter circuits forming first and second data storage nodes with loop connection, first and second access portions operable to access the first and second data storage nodes, respectively, and a holding control portion connected in series with a drive transistor of the second inverter circuit. The memory cell is operable to switch a low power source potential of at least one of the first and second inverter circuits. For this purpose, the memory cell has means for switching the low power source potential of the first inverter circuit.

In the semiconductor memory device according to the first aspect, the memory cell is operable to switch the low power source potential of the first inverter circuit by a low potential switching portion provided between the low power source potential of the first inverter circuit and a ground potential.

In the semiconductor memory device according to the first aspect, the low potential switching portion is operable to bring the low power source potential into a floating state in a writing operation of the memory cell.

In the semiconductor memory device according to the first aspect, the low potential switching portion is operable to bring the low power source potential into a low potential higher than the ground potential in a writing operation of the memory cell and bring the low power source potential into the ground potential in a reading operation of the memory cell and in a data holding state.

In the semiconductor memory device according to the first aspect, the low potential switching portion is implemented by a transistor connected between the low power source potential of the first inverter circuit and the ground potential with a gate electrode to which an inverse write signal is inputted.

In the semiconductor memory device according to the first aspect, the low potential switching portion may comprise a first transistor connected between the low power source potential of the first inverter circuit and the ground potential with a gate electrode connected to a high power source potential and a second transistor connected between the low power source potential of the first inverter circuit and the high power source potential with a gate electrode to which an inverse write signal is inputted.

In the semiconductor memory device according to the first aspect, the low potential switching portion may comprise a first transistor connected between the low power source potential of the first inverter circuit and the ground potential with a gate electrode connected to a high power source potential and a second transistor connected between the low power source potential of the first inverter circuit and the high power source potential with a gate electrode to which a write signal is inputted.

In a variation of the semiconductor memory device according to the first aspect, the memory cell may have means for switching a low power source potential of the first and second inverter circuits.

In the variation of the semiconductor memory device, the memory cell is operable to switch the low power source potential of the first and second inverter circuits by a low potential switching portion provided between the low power source potential of the first and second inverter circuits and a ground potential.

In the variation of the semiconductor memory device, the low potential switching portion is operable to bring the low power source potential into the ground potential in reading and writing operations of the memory cell and bring the low power source potential into a low potential higher than the ground potential in a data holding state.

In the variation of the semiconductor memory device, the low potential switching portion may be operable to bring the low power source potential into the ground potential in a reading operation of the memory cell and bring the low power source potential into a low potential higher than the ground potential in a writing operation of the memory cell and in a data holding state.

In the variation of the semiconductor memory device, the low potential switching portion comprises a first transistor connected between the low power source potential of the first and second inverter circuits and the ground potential with a gate electrode connected to a pre-charge signal and a second transistor having a gate electrode connected to the low power source potential.

In the variation of the semiconductor memory device, the low potential switching portion may comprise a first transistor connected between the low power source potential of the first and second inverter circuits and the ground potential with a gate electrode connected to a read enable signal and a second transistor having a gate electrode connected to the low power source potential.

In the variation of the semiconductor memory device, the low potential switching portion may comprise a first transistor connected between the low power source potential of the first and second inverter circuits and the ground potential with a gate electrode connected to a pre-charge signal, a second transistor having a gate electrode connected to the low power source potential, and a third transistor connected between the low power source potential of the first and second inverter circuits and a high power source potential with a gate electrode connected to a write enable signal.

In the variation of the semiconductor memory device, the low potential switching portion may comprise a first transistor connected between the low power source potential of the first and second inverter circuits and the ground potential with a gate electrode connected to a pre-charge signal, a second transistor having a gate electrode connected to the low power source potential, and a third transistor connected between the low power source potential of the first and second inverter circuits and a high power source potential with a gate electrode connected to an inverse write enable signal.

In a semiconductor memory device according to a second aspect of the present invention, the memory cell has first and second inverter circuits forming first and second data storage nodes with loop connection, first and second access portions operable to access the first and second data storage nodes, respectively, and a holding control portion connected in series with a drive transistor of the second inverter circuit. The memory cell has means for switching a high potential of the first and second inverter circuits.

In the semiconductor memory device according to the second aspect, the means for switching the high potential is a high potential switching portion provided between the high power source potential and a power source.

In the semiconductor memory device according to the second aspect, the high potential switching portion is operable to bring the high power source potential of the first and second inverter circuits into a floating state in a writing operation of the memory cell.

In the semiconductor memory device according to the second aspect, the memory cell is operable to switch a low power source potential of the first and second inverter circuits by a low potential switching portion provided between the low power source potential of the first and second inverter circuits and a ground potential.

In the semiconductor memory device according to the second aspect, the high potential switching portion comprises a first transistor connected between the high power source potential of the first and second inverter circuits and a power source with a gate electrode connected to a write enable signal.

In a semiconductor memory device according to a third aspect of the present invention, the memory cell has first and second inverter circuits forming first and second data storage nodes with loop connection, first and second access portions operable to access the first and second data storage nodes, respectively, a holding control portion connected in series with a drive transistor of the second inverter circuit, and a replica memory cell. The memory cell is controlled by a control signal having a pulse width equal to a period of time required for reading of the replica memory cell.

In the semiconductor memory device according to the third aspect, the holding control portion is operable to bring the drive transistor of the second inverter circuit out of conduction in a reading operation of the memory cell by the control signal.

In the semiconductor memory device according to the third aspect, a read word line signal is generated by the control signal, and the read word line signal has an activation pulse width equal to the pulse width of the control signal.

In a semiconductor memory device according to a fourth aspect of the present invention, the memory cell has first and second inverter circuits forming first and second data storage nodes with loop connection, first and second access portions operable to access the first and second data storage nodes, respectively, and a holding control transistor connected in series with a drive transistor of the second inverter circuit. A leakage current of the holding control transistor or a leakage current of the second access portion is increased in a reading operation of the memory cell.

In the semiconductor memory device according to the fourth aspect, the leakage current is increased by bringing a low potential inputted to the holding control transistor or the second access portion into a potential higher than a ground potential in the reading operation of the memory cell.

A semiconductor memory device according to a fifth aspect of the present invention includes a memory cell array in which a plurality of memory cells each formed by seven transistors and laid out within an L-shaped area are laid out in a mirror reversing manner. The semiconductor memory device is characterized in that an element forming a low potential switching portion or a high potential switching portion is laid out in a central space of the memory cell array.

In a semiconductor memory device according to a sixth aspect of the present invention, the memory cell has first and second inverter circuits forming first and second data storage nodes with loop connection, first and second access portions operable to access the first and second data storage nodes, respectively, a first transistor connected in series with a drive transistor of the second inverter circuit, and a replica memory cell. A plurality of replica memory cells may be used and multiplexed.

According to a seventh aspect of the present invention, there is provided a driving method of a semiconductor memory device including a memory cell. The memory cell has first and second inverter circuits forming first and second data storage nodes with loop connection, first and second access transistors operable to access the first and second data storage nodes, respectively, and a first transistor connected in series with a drive transistor of the second inverter circuit. An off time of the first transistor is controlled depending upon a relationship between a sum of an off-state leakage current of the second access transistor and an off-state leakage current of the drive transistor of the second inverter circuit, and an off-state leakage current of a load transistor of the second inverter circuit.

In a driving method of a semiconductor memory device according to an eighth aspect of the present invention, the memory cell has first and second inverter circuits forming first and second data storage nodes with loop connection, first and second access transistors operable to access the first and second data storage nodes, respectively, and a first transistor connected in series with a drive transistor of the second inverter circuit. Particularly, a leakage current of the second access transistor or a leakage current of the drive transistor of the second inverter circuit is controlled.

In a semiconductor memory device according to a ninth aspect of the present invention, the memory cell has first and second inverter circuits forming first and second data storage nodes with loop connection, first and second access transistors operable to access the first and second data storage nodes, respectively, and a first transistor connected in series with a drive transistor of the second inverter circuit. The memory cell also has a second transistor provided between a low power source potential of the first inverter circuit and a ground potential with a gate electrode to which an inverse write signal is inputted.

According to a tenth aspect of the present invention, there is provided a driving method of a semiconductor memory device including a memory cell having first and second inverter circuits forming first and second data storage nodes with loop connection, first and second access portions operable to access the first and second data storage nodes, respectively, and a first transistor connected in series with a drive transistor of the second inverter circuit. The memory cell is operable to switch a low power source potential of at least one of the first and second inverter circuits in a writing operation of the memory cell.

In the driving method of a semiconductor memory device according to the tenth aspect, the memory cell is operable to bring the low power source potential of the first inverter circuit into a floating state in the writing operation of the memory cell.

In a driving method of a semiconductor memory device according to an eleventh aspect of the present invention, the memory cell has first and second inverter circuits forming first and second data storage nodes with loop connection, first and second access portions operable to access the first and second data storage nodes, respectively, and a holding control portion connected in series with a drive transistor of the second inverter circuit. The memory cell is operable to bring a low power source potential of the first and second inverter circuits into a ground potential in reading and writing operations of the memory cell and bring it into a low potential higher than the ground potential in a data holding state.

Effects of the Invention

A memory cell in a semiconductor memory device according to the present invention has first and second inverter circuits forming first and second data storage nodes with loop connection, first and second access portions operable to access the first and second data storage nodes, respectively, and a holding control portion connected in series with a drive transistor of the second inverter circuit. The memory cell is configured to switch a low power source potential by a low potential switching portion provided between the low power source potential of the first inverter circuit and a ground potential or provided between the low power source potential of the first and second inverter circuits and a ground potential.

Thus, it is possible to obtain effects of reducing a leakage current and enlarging a write margin.

Furthermore, in the memory cell, an off period and a read activation period of the holding control portion are controlled by using a signal having a pulse width equal to a reading time of a replica memory cell. Thus, it is possible to obtain an effect of enlarging a read margin. Furthermore, a low potential of a write word line signal or an inverse word line signal is brought into a voltage slightly higher than the ground potential in a reading operation. As a result, it is possible to obtain effects of preventing corruption of stored data in a reading operation and enlarging a read margin.

In a semiconductor memory device according to the present invention, an element forming a low potential switching portion or a high potential switching portion is laid out in a central space of a memory cell array in which memory cells each formed by seven transistors and laid out within an L-shaped area are reversed with a mirror. As a result, it is possible to obtain a highly integrated semiconductor memory device. With the aforementioned method and structure of the present invention, it is possible to obtain a semiconductor memory device capable of operating at a low voltage and a high speed.

BRIEF DESCRIPTION OF DRAWINGS

FIGS. 7A and 7B are diagrams explanatory of a reading state of the SRAM cell shown in FIG. 5, wherein FIG. 7A shows stored data "0" and FIG. 7B shows stored data "1".

FIGS. 15A to 15C are diagrams explanatory of a main word driver output circuit in the second example, wherein FIG. 15A shows a circuit of an output stage, FIG. 15B shows operation waveforms, and FIG. 15C shows a low potential generation circuit.

BEST MODE FOR CARRYING OUT THE INVENTION

Figure 1:
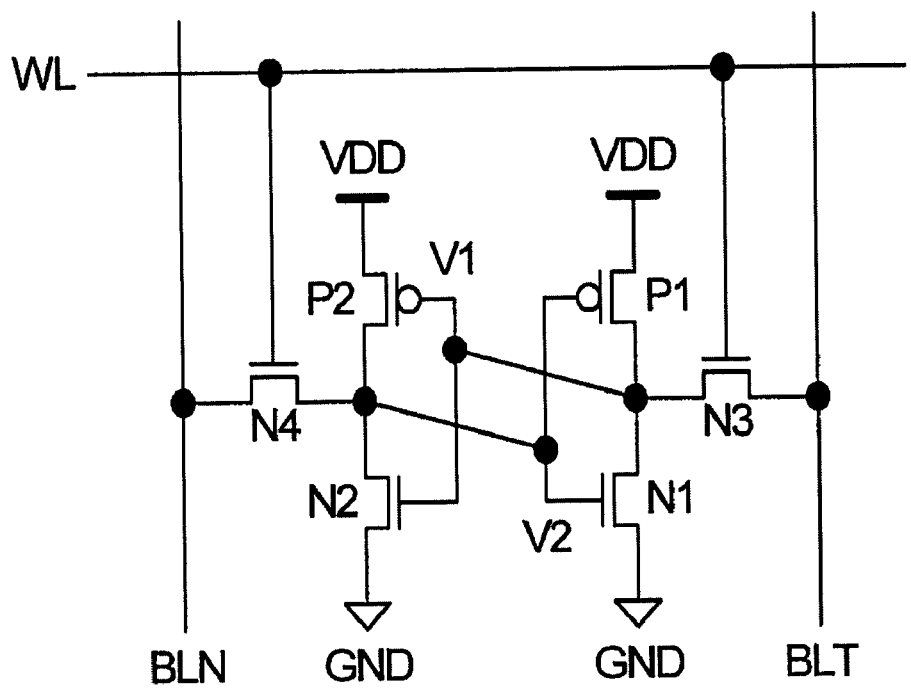
FIG. 1 is a circuit diagram of a conventional SRAM cell formed by six transistors.
Figure 2:
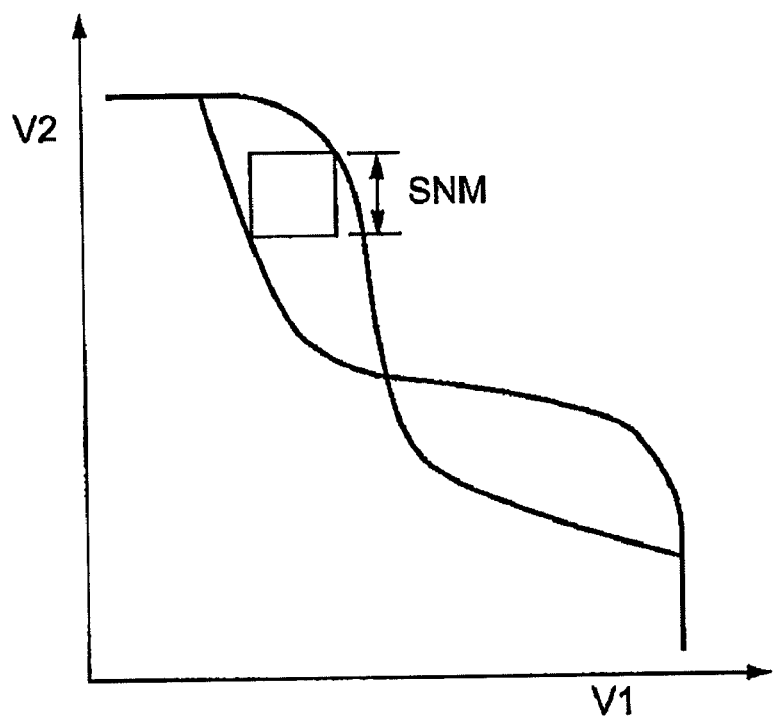
FIG. 2 is a graph showing a butterfly curve of a conventional SRAM cell formed by six transistors.
Figure 3:
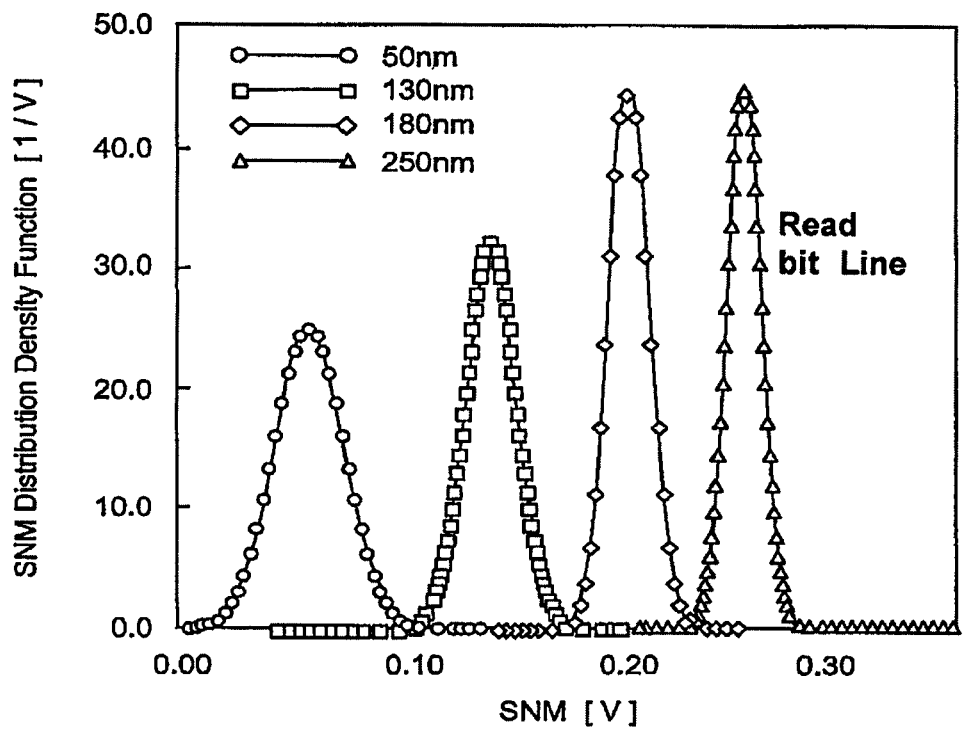
FIG. 3 is a graph showing channel dependence of SNMs in a conventional SRAM cell formed by six transistors.
Figure 4:
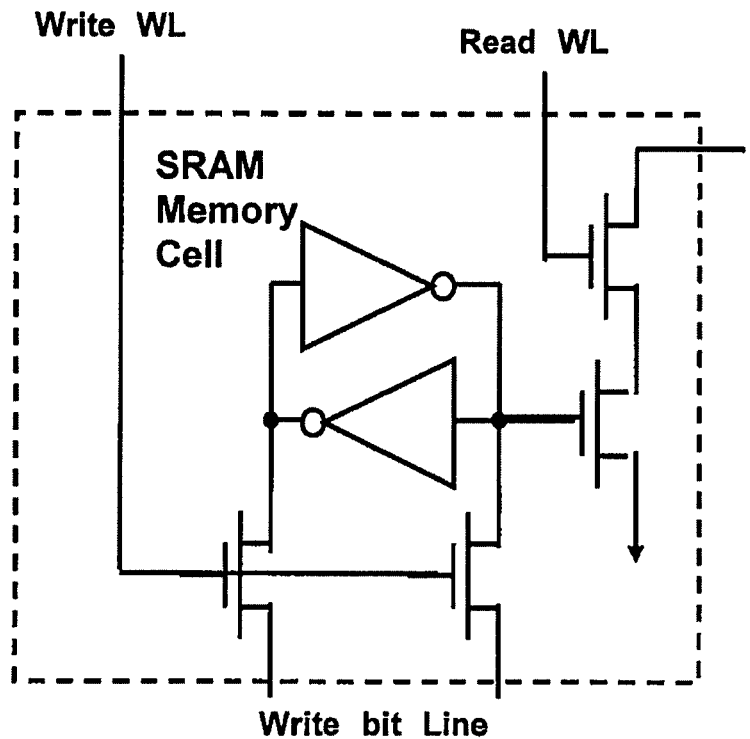
FIG. 4 is a block diagram of a conventional SRAM cell formed by eight transistors.
Figure 5:
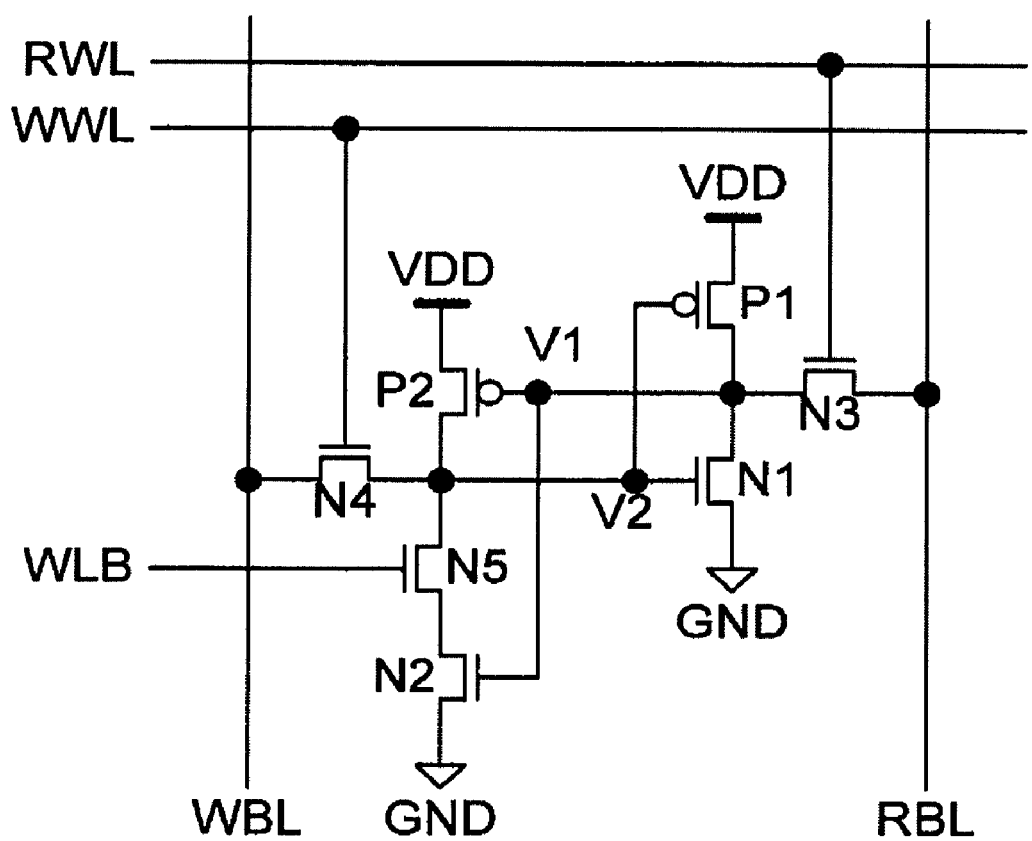
FIG. 5 is a circuit diagram of an SRAM cell formed by seven transistors according to the present invention.
Figure 6A:
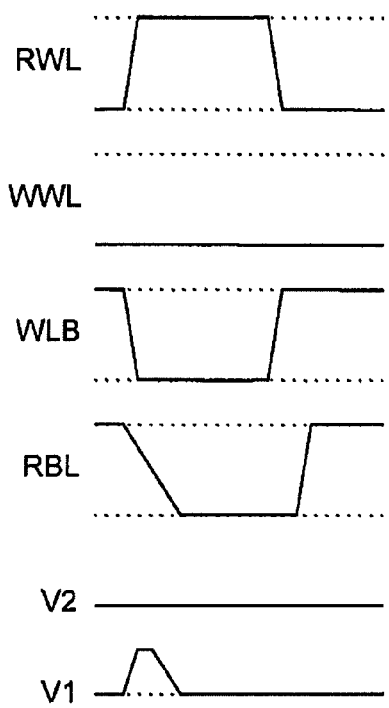
FIGS. 6A to 6D are diagrams showing waveforms in reading and writing operations of the SRAM cell shown in FIG. 5.
Figure 6B:
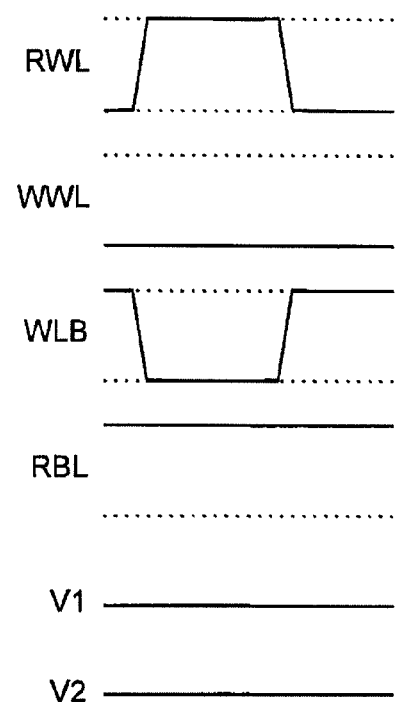
Figure 6C:
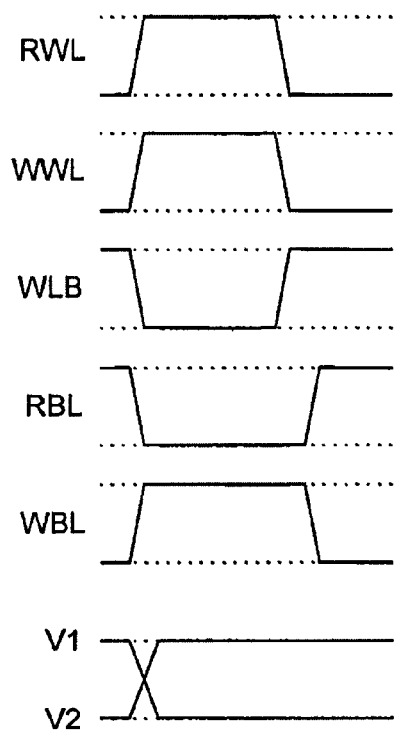
Figure 6D:
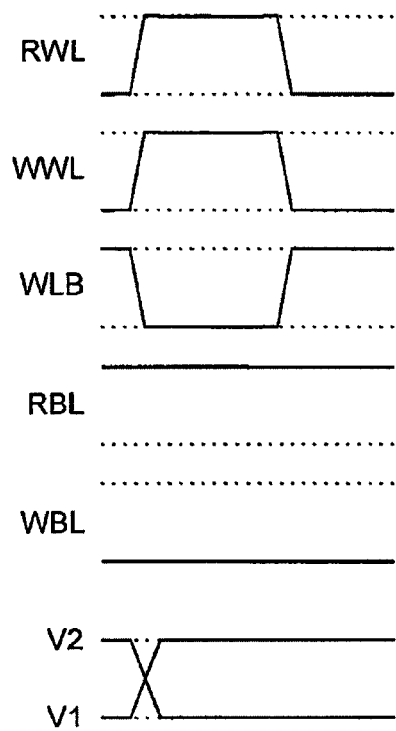
Figure 7A:
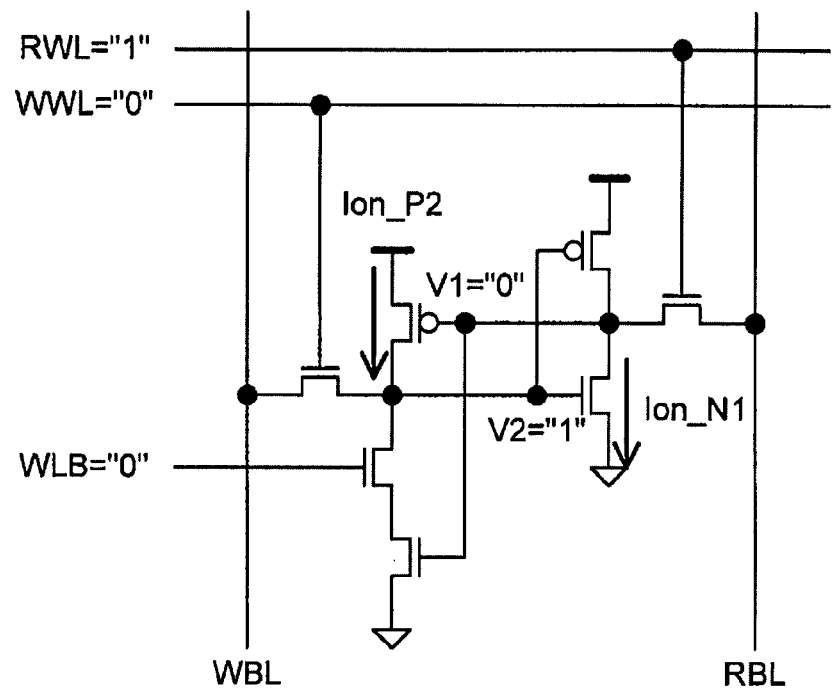
Figure 7B:
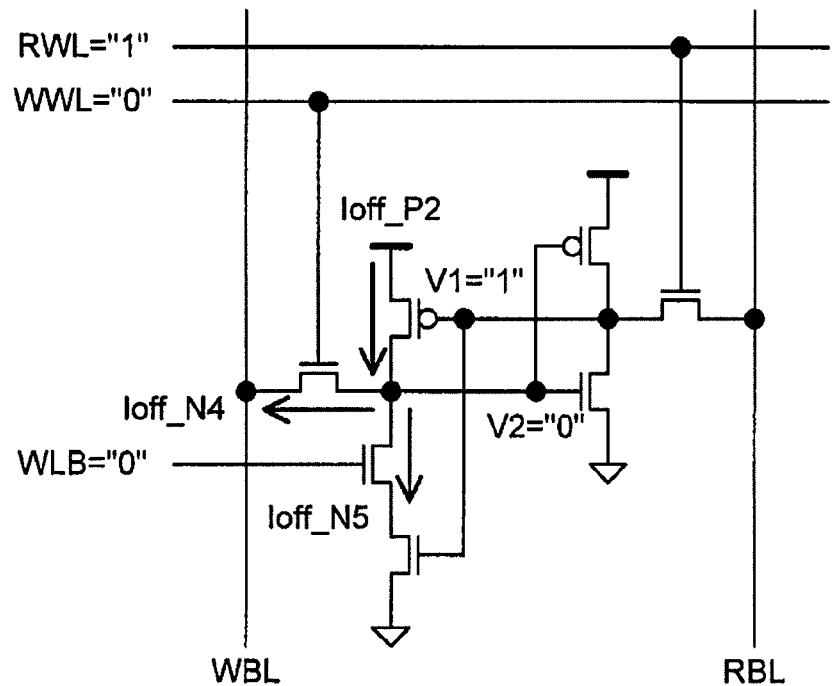
Figure 8A:
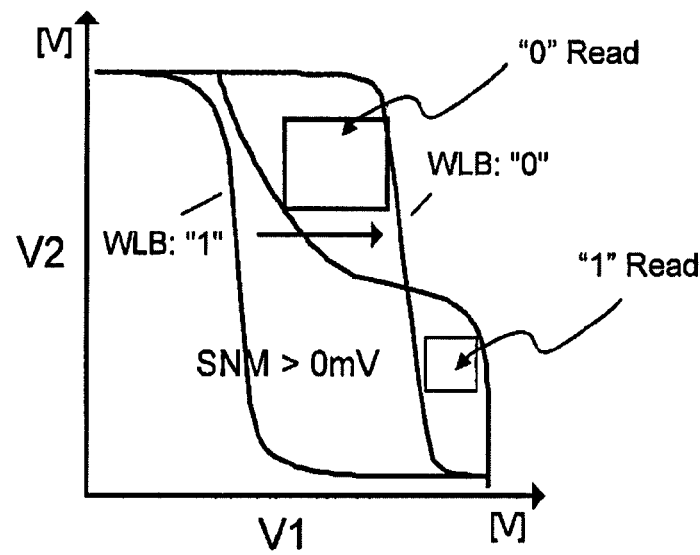
FIGS. 8A and 8B are diagrams showing butterfly curves according to magnitudes of leakage currents in the SRAM cell shown in FIG. 5.
Figure 8B:
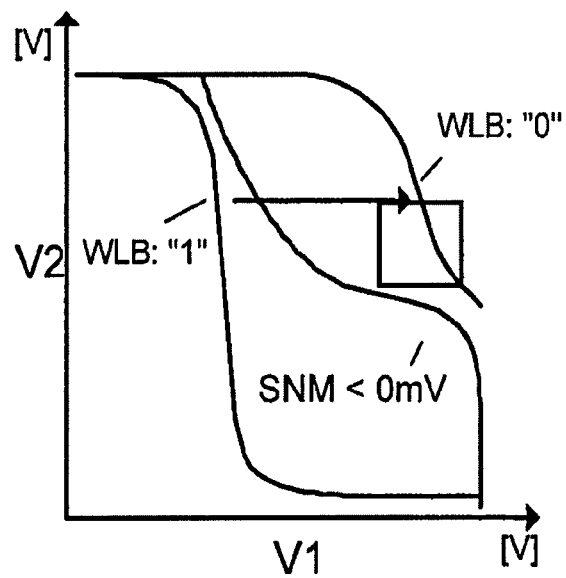

An SRAM cell according to the present invention will be described below with reference to the drawings. FIG. 5 is a diagram showing a circuit structure of an SRAM cell formed by seven transistors according to the present invention. FIGS. 6A to 6D are diagrams showing operation waveforms in a reading operation and a writing operation of the SRAM cell according to the present invention. FIGS. 7A and 7B are state diagrams in a reading operation of the SRAM cell according to the present invention. FIGS. 8A and 8B show SNMs based on a difference in leakage current of the SRAM cell according to the present invention.

The SRAM cell shown in FIG. 5 is formed by seven transistors including an NMOS transistor N5 added as a holding control portion to a conventional SRAM cell formed by six transistors. Signal lines are formed by a read word line RWL, a write word line WWL, a read bit line RBL used for both reading and writing, and a write bit line WBL used for only writing. Although the holding control transistor N5 is added between a storage node V2 and a drive NMOS transistor N2 in FIG. 5, it may be inserted between the drive NMOS transistor N2 and a ground potential GND.

A first CMOS inverter circuit using the storage node V2 as an input and using a storage node V1 as an output is formed by a load PMOS transistor P1 and a drive NMOS transistor N1. A second CMOS inverter circuit using the storage node V1 as an input and using the storage node V2 as an output is formed by a load PMOS transistor P2, the drive NMOS transistor N2, and the holding control transistor N5. The first and second CMOS inverter circuits form the first and second storage nodes with loop connection. An access NMOS transistor N3 connected between the read bit line RWL and the storage node V1 is configured to access the storage node V1 via the read word line signal RWL. An access NMOS transistor N4 connected between the write bit line WBL and the storage node V2 is configured to access the storage node V2 via the write word line signal WWL. In the following description, NMOS transistors are abbreviated as transistors N, and PMOS transistors are abbreviated as transistors P.

The holding control transistor N5 is inserted between the storage node V2 and the drive transistor N2 of the second CMOS inverter. A drain, a source, and a gate of the holding control transistor N5 are connected to the storage node V2, a drain of the drive transistor N2, and an inverse word line signal WLB, respectively. The inverse word line signal WLB turns the holding control transistor N5 on and off so as to bring the loop connection of the first and second CMOS inverter circuits into and out of conduction. The loop connection of the first and second CMOS inverter circuits is switched by the holding control transistor N5 so as to switch the holding state of the SRAM cell between a static holding state and a dynamic holding state.

In a holding state in which the SRAM cell is not accessed, the holding control transistor N5 is turned on by a high potential "1" of the inverse word line signal WLB, and the load transistor P2 and the drive transistor N2 are connected via the holding control transistor N5 so as to form the second CMOS inverter circuit. Thus, the first CMOS inverter circuit and the second CMOS inverter circuit are connected to each other with a loop being formed, so that information can stably be held. This holding state with a loop connection is referred to as a static holding state.

In a state in which the SRAM cell is accessed, the holding control transistor N5 is turned off by a low potential "0" of the inverse word line signal WLB. Accordingly, the load transistor P2 is disconnected from the drive transistor N2. The loop connection of the first and second CMOS inverter circuits is cut so as to disconnect a holding circuit. However, a state prior to the cutting can be held for a short period of time during which the memory cell is accessed. This holding state is referred to as a dynamic holding state. The holding control transistor N5 switches the holding state of the SRAM cell between the static holding state and the dynamic holding state.

The reading and writing operations will be described below with reference to FIGS. 6A to 6D. FIG. 6A shows "0" reading operation, and FIG. 6B shows "1" reading operation. FIG. 6C shows "0" writing operation, and FIG. 6D shows "1" writing operation. Here, data "0" and "1" of the memory cell represent a state of data with respect to the storage node V1. In the reading operation, the read word line signal RWL is set to have a high potential "1", and the inverse word line signal WLB is set to have a low potential "0". The write word line WWL is set to have a low potential "0". In the writing operation, the read word line signal RWL and the write word line WWL are set to have a high potential "1", and the inverse word line signal WLB is set to have a low potential "0".

In the case of the reading operation shown in FIG. 6A in which the storage node V1 has a low potential "0" (while the storage node V2 has a high potential "1"), the access transistor N3 is turned on by a high potential "1" of the read word line signal RWL, so that the read bit line RBL and the storage node V1 are brought into conduction with each other. Since the inverse word line signal WLB is controlled to have a low potential "0", the holding control transistor N5 is turned off. The storage node V2 dynamically holds a high potential "1". Accordingly, the drive transistor N1 remains in an on state. The high potential "1" of the read bit line RBL is discharged into a low potential "0", and the low potential "0" of the storage node V1 is read into the read bit line RBL. At that time, even if the potential of the storage node V1 is temporarily increased from the low potential "0", the potential of the read bit line BL [sic] is discharged into a low potential "0" by continuously holding the storage node V2 of the second CMOS inverter at a high potential "1". Therefore, a reading operation can be performed without corruption of the stored data.

Meanwhile, in the case of the reading operation shown in FIG. 6B in which the storage node V1 has a high potential "1" (while the storage node V2 has a low potential "0"), the access transistor N3 is turned on by a high potential "1" of the read word line signal RWL, so that the read bit line RBL and the storage node V1 are brought into conduction with each other. The holding control transistor N5 is turned off, and the storage node V2 dynamically holds a low potential "0". The drive transistor N1 is in an off state, and both of the storage node V1 and the read bit line RBL have a high potential "1". Accordingly, the high potential "1" of the storage node V1 is directly read into the read bit line RBL without a discharging operation in the read bit line RBL. Therefore, the potential of the read bit line RBL and the potentials of the storage node V1 and the storage node V2 are not changed.

In the case of the "0" writing operation shown in FIG. 6C, the read word line signal RWL and the write word line signal WWL are brought into a high potential "1" so as to activate the access transistors N3 and N4. The inverse word line signal WLB is brought into a low potential "0" so as to turn the holding control transistor N5 off. A low potential "0" as write data is applied to the read bit line RBL, and a high potential "1" as inverse data is applied to the write bit line WBL. The low potential "0" of the write bit line WBL [sic] is written into the storage node V1, and the high potential "1" of the read bit line RBL [sic] is written into the storage node V2. The drive transistor N1 is turned on, whereas the load transistor P1 is turned off. Thus, "0" is written into the memory cell.

In the case of the "1" writing operation shown in FIG. 6D, the read word line signal RWL and the write word line signal WWL are brought into a high potential "1" so as to activate the access transistors N3 and N4. The inverse word line signal WLB is brought into a low potential "0" so as to turn the holding control transistor N5 off. A high potential "1" as write data is applied to the read bit line RBL, and a low potential "0" as inverse data is applied to the write bit line WBL. The low potential "0" of the write bit line WBL is written into the storage node V2, and the high potential "1" of the read bit line RBL is written into the storage node V1. The drive transistor N1 is turned off, whereas the load transistor P1 is turned on. Thus, "1" is written into the memory cell.

Next, the dynamic holding state of an SRAM cell formed by seven transistors will be examined. In the "0" reading operation shown in FIG. 7A, the storage node V1 is temporarily increased from a low potential "0" according to the reading operation. However, the potential of the storage node V1 does not reach a high potential "1". Accordingly, an on-state current Ion_P2 is supplied to the storage node V2 via the load transistor P2. The access transistor N4 and the holding control transistor N5 are turned off so that the storage node V2 can stably be held at a high potential "1".

Meanwhile, in the "1" reading operation shown in FIG. 7B, when the holding control transistor N5 is turned off, a current path for pulling the storage node V2 down to a low potential "0" is broken. All of the transistors P2, N5, and N4 connected to the storage node V2 are in an off state, and the storage node V2 is in a floating state. Thus, it is difficult to reliably hold the low potential "0". However, this depends upon magnitudes of off-state leakage currents of the transistors P2, N5, and N4. FIGS. 8A and 8B show SNMs according to these leakage currents. Here, off-state leakage currents of the transistors P2, N5, and N4 are represented by Ioff_P2, Ioff_N5, and Ioff_N4, respectively.

If the conditions of Ioff_N4+Ioff_N5>>Ioff_P2 shown in FIG. 8A are met, then the input-output characteristics of the second inverter circuit are shifted rightward to a large extent when the inverse word line signal WLB is brought into a low potential "0" so as to turn the holding control transistor N5 off. Thus, the "0" read margin is enlarged to a large degree, and the "1" read margin is reduced. However, since the storage node V2 can hold a low potential, the "1" read margin is maintained.

If the conditions of Ioff_N4+Ioff_N5<Ioff_P2 shown in FIG. 8B are met, then the input-output characteristics of the second inverter circuit are shifted rightward to a large extent when the inverse word line signal WLB is brought into a low potential "0" so as to turn the holding control transistor N5 off. Additionally, the storage node V2 as an output of the second inverter circuit does not reach "0". This means that the potential "0" of the storage node V2 is charged by a leakage current of the load transistor P2 and increased eventually to a potential "1" so that the stored data are corrupted.

If the conditions of Ioff_N4+Ioff_N5<Ioff_P2 shown in FIG. 8B are met, then data cannot be held statically. However, data can be held dynamically by time-controlling the SRAM cell. Here, a retention time is defined as a period of time during which the low potential "0" of the storage node V2 is increased to a threshold voltage of the drive transistor N1, and an off time of the holding control transistor N5 is defined as a period of time from the time when the holding control transistor N5 is turned off to the time when the holding control transistor N5 is turned on after a reading operation has been completed. When the retention time is longer than the off time of the holding control transistor N5, a reading operation is completed before the low potential "0" of the storage node V2 is increased to a threshold voltage of the drive transistor N1. A normal reading operation is performed by turning the holding control transistor N5 on. On the other hand, when the retention time is shorter than the off time of the holding control transistor N5, the potential "0" of the storage node V2 is increased to the threshold voltage of the drive transistor N1. The drive transistor N1 is turned on, so that the data of the storage node V2 are corrupted. Thus, a normal reading operation is not performed. However, a reading operation can be performed without data corruption by shortening the off time of the holding control transistor N5.

According to the present invention, the off time of the holding control transistor N5 is determined by the reading completion time. As a result, there is provided a semiconductor device capable of holding a high potential "1" of the storage node V1 stably for a predetermined period of time.

Furthermore, a leakage current of the holding control transistor N5 or a leakage current of the access transistor N4 is controlled during a reading operation so as to meet the conditions of Ioff_N4+Ioff_N5>>Ioff_P2. As a result, there is provided a semiconductor memory device capable of stably holding stored data.

The SRAM cell formed by seven transistors according to the present invention employs fine transistors having a channel length of 100 nm or less. However, for the following reasons, there is provided a semiconductor memory device capable of reducing a leakage current by switching a low power source potential of the first inverter circuit and the second inverter circuit. When the low power source potential and one of the storage nodes are increased from the ground potential, a source potential of the access transistor becomes higher than the ground potential. As a result, a leakage current of the access transistor is reduced by the back-bias effect and the back-gate effect. Then, a source potential of the drive transistor becomes higher than the ground potential. As a result, a leakage current of the drive transistor is reduced by the back-bias effect. Furthermore, a leakage current of the load transistor is reduced because a potential between the drain and the source is lowered.

Furthermore, according to the present invention, a high power source potential of the SRAM cell formed by seven transistors is set to be lower than a power source potential in a writing operation. Alternatively, a low power source potential of the SRAM cell is set to be higher than the ground potential. As a result, for the following reasons, there is provided a semiconductor memory device capable of enlarging a write margin. In the drive transistors and the load transistors which are turned on to hold data on the storage nodes, voltages between gates and sources are lowered so that currents for holding the storage nodes are reduced. Accordingly, writing from the access transistors is facilitated.

The structure, control method, and peripheral circuits of the semiconductor memory device according to the present invention will be described in detail with reference to the drawings.

FIRST EXAMPLE

A first example will be described with reference to FIGS. 9 to 13. A semiconductor device in the first example employs SRAM cells each formed by seven transistors as shown in FIG. 5. In order to more reliably hold data of the SRAM cells in a reading operation, an off time of the holding control transistors is set to be equal to a minimum pulse width to thereby prevent corruption of holding data of the SRAM cells.

Figure 9:
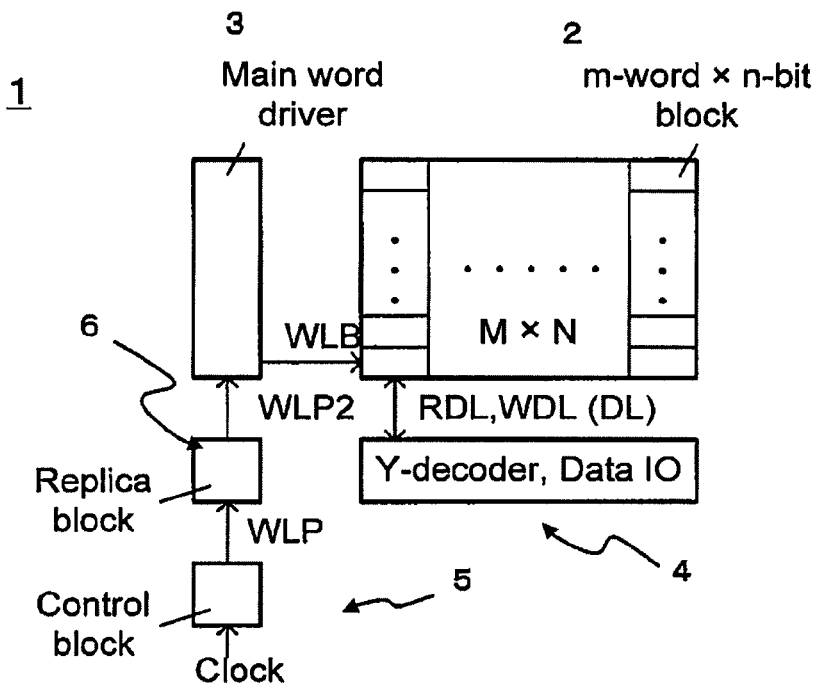
FIG. 9 is a diagram explanatory of a flow of signals between blocks in a first example of the present invention.
Figure 10:
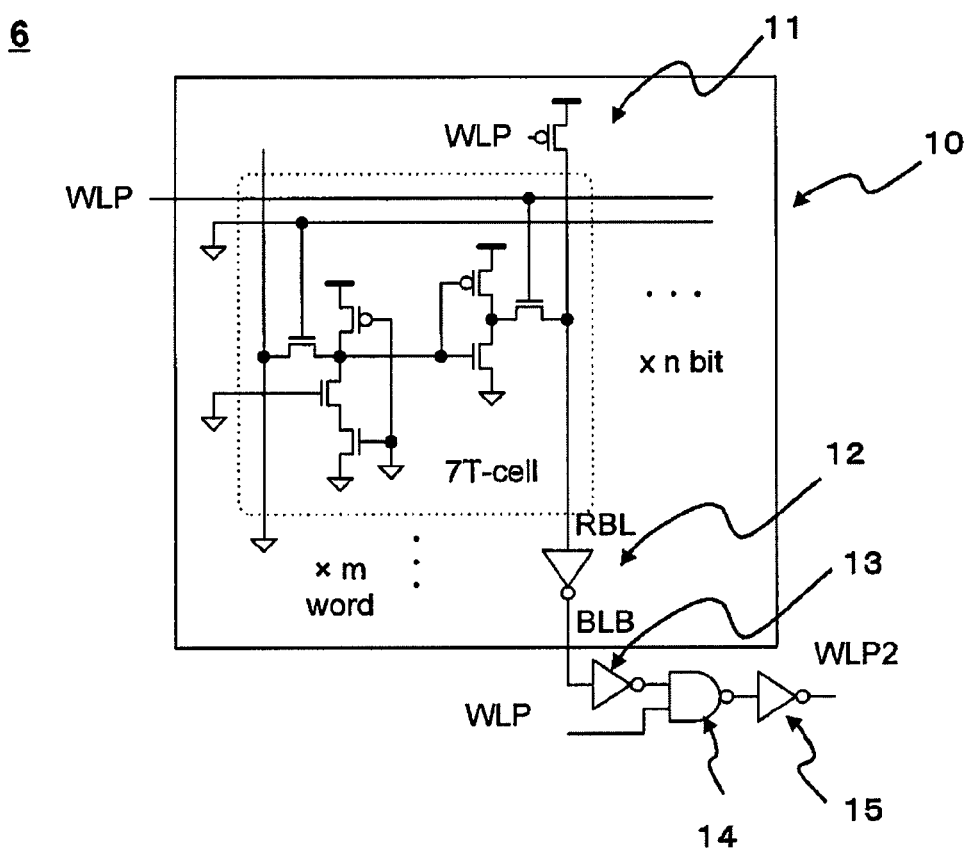
FIG. 10 is a diagram showing a circuit structure of a replica block in the first example.
Figure 11:
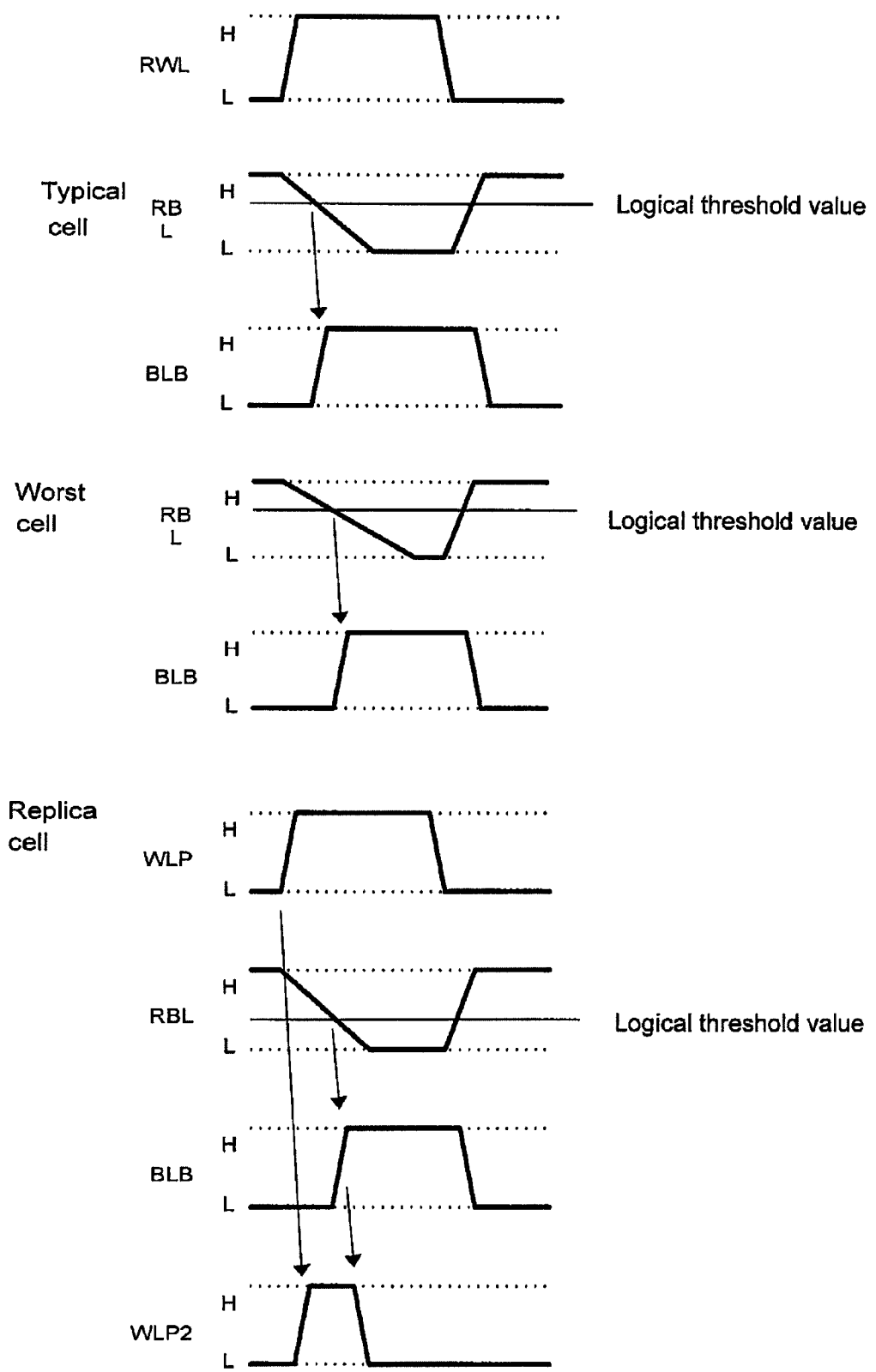
FIG. 11 is a diagram showing operation waveforms of an SRAM cell and a replica block in the present invention.
Figure 12:
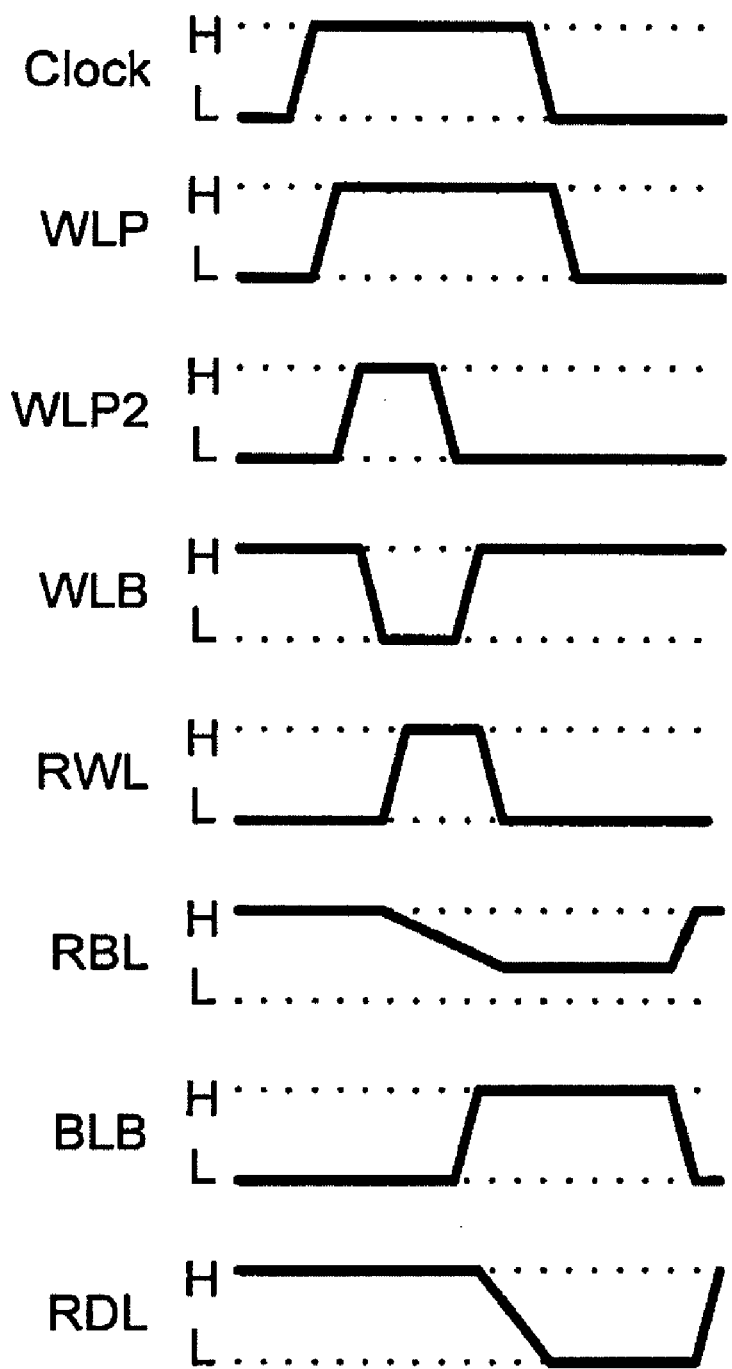
FIG. 12 is a diagram showing operation waveforms in a reading operation using a replica block in an SRAM cell according to the present invention.
Figure 13:
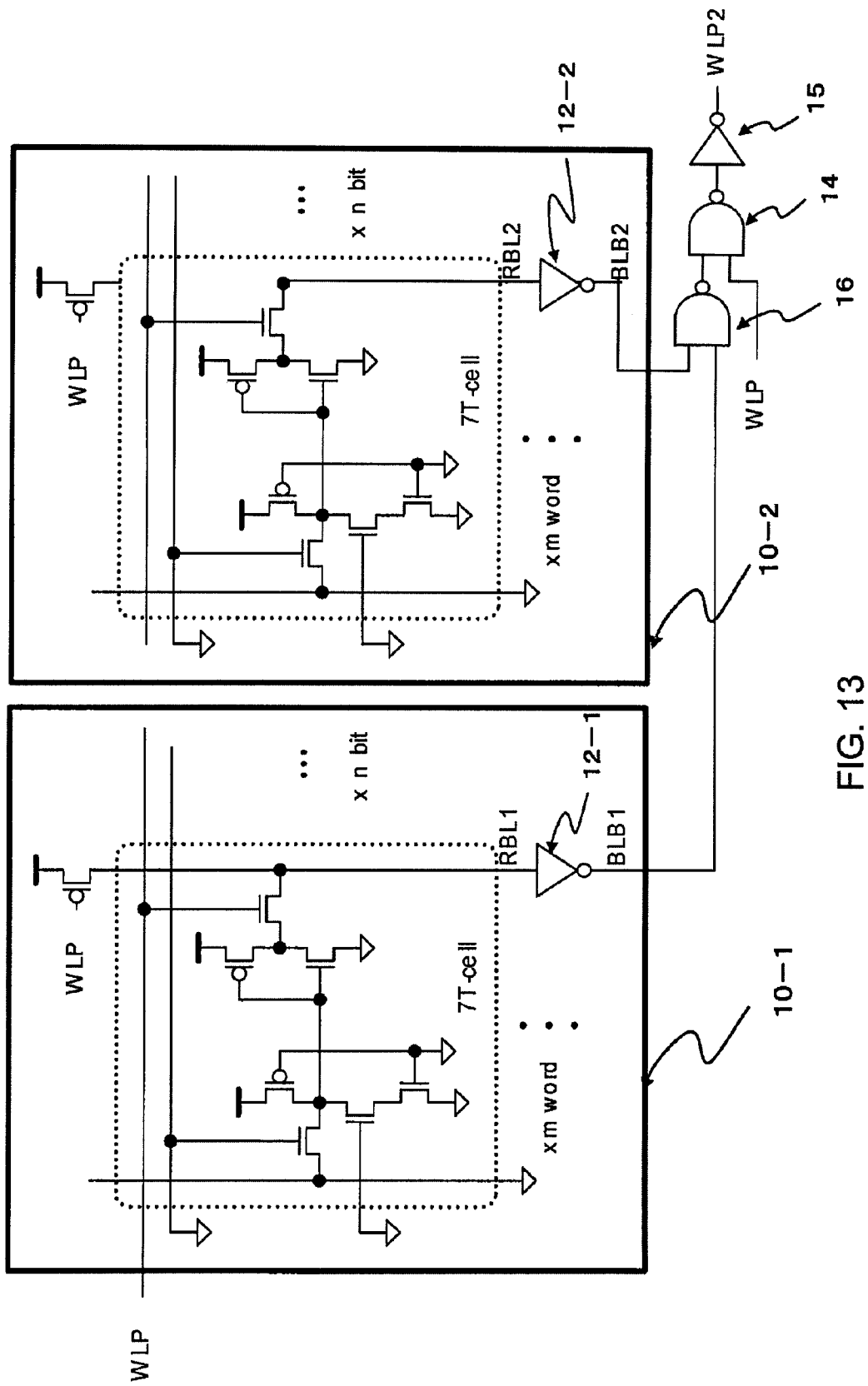
FIG. 13 is a diagram of a replica block in which replica circuits are multiplexed in the present invention.

FIG. 9 shows a block arrangement explanatory of a flow of signals, and FIG. 10 shows a replica block. FIG. 11 shows operation waveforms of the replica block, and FIG. 12 shows operation waveforms of an SRAM block and an SRAM cell. FIG. 13 shows a multiplexed replica block.

In the semiconductor memory device 1 shown in FIG. 9, blocks 2 each having an SRAM cell of m words and n bits are arranged in the form of an M×N matrix. Each block has a sub-word driver and a sense amplifier (not shown). The sub-word driver is operable to activate a word line selected by a signal from a main word driver 3 and a block select signal so as to access the SRAM cell and communicate data via the sense amplifier and a Y-decoder and data circuit 4. The following description is focused on portions relating to the present invention. Other circuit structures and operations are the same as those of a conventional example, and the details thereof are omitted herein.

A replica block 6 is operable to generate a second pre-word signal WLP2 with use of a pre-word signal WLP from a control block 5 into which a clock signal and command are inputted. The pulse width of the second pre-word signal WLP2 is set to be equal to a period of time required for reading of a replica SRAM cell in the replica block 6. The main word driver 3 is operable to generate a selected inverse word line signal WLB from the inputted second pre-word signal WLP2 and an address signal (not shown) and output it to the sub-word driver of the block 2. The inverse word line signal WLB and the block select address signal are inputted to the sub-word driver, which activates the selected word line.

FIG. 10 shows an arrangement of the replica block 6. The replica block 6 is configured to detect a reading completion time of the SRAM cell in the block 2. The replica block 6 is formed by a replica SRAM cell including seven transistors, a replica circuit 10 having a sense amplifier including a pre-charge transistor 11 and an inverter 12, and a logic circuit. The transistors of the replica SRAM cell have the same size as a normal SRAM cell in a memory cell array. Those transistors are connected so that stored data are "0". Stored data are set to be "0" because a reading time of "0" is longer than a reading time of "1". Here, data of the SRAM cell are referred to data stored on the storage node V1.

In the replica SRAM cell, an input of a second CMOS inverter circuit is connected to GND so that stored data are fixed at "0". The pre-word signal WLP is supplied to a read word line. A write word line, a write bit line, and a gate of a holding control transistor are fixed to GND. Here, in order to maintain the same reading time as that of a normal SRAM cell in the block, the replica block may be formed by the same number of SRAM cells as in the block 2. Alternatively, the replica block may equivalently be configured by adding capacities to the read word line so as to correspond to n bits and to a read bit line so as to correspond to m words.

The read bit line RBL is connected to the sense amplifier, inversed by the inverter circuit 12 of the sense amplifier, and inputted as an inverse read bit line signal BLB to the logic circuit. The logic circuit is formed by an inverter 13, an NAND circuit 14, and an inverter 15. The inverter 13 further inverts the inputted inverse read bit line signal BLB and outputs the inverted signal. The output of the inverter 13 and a pre-word line signal WLP are inputted to the NAND circuit 14, which narrows the pulse width of the pre-word line signal WLP into the signal from the read bit line. The signal from the NAND circuit 14 is further inverted and outputted as the second pre-word line signal WLP2 from the inverter 15. The second pre-word line signal WLP2 is delayed by the NAND circuit 14 and the inverter 15. However, a delay for buffering the pre-word line signal WLP is also produced in a main word driver and a control block of a conventional arrangement. Thus, an overhead of the delay time is based only on a change of an inverter to the NAND circuit.

A flow of signals in the replica block 6 will be described with reference to the operation waveforms shown in FIG. 11. Reading operations of a typical cell and a worst cell and a reading operation of the replica block are contrastively illustrated in FIG. 11. In the normal SRAM cell, when the read word line signal RWL is brought into a high potential "1" to bring the access transistor N3 into conduction, the potential of the read bit line RBL, which has been pre-charged into a high potential "1", is gradually lowered. Then, when the potential of the read bit line RBL becomes lower than a logical thresh-old value of the inverter 12, the inverter 12 inverses the signal and outputs the inverse read bit line signal BLB of a high potential "1". The reading time is defined as a period of time from the time when the word line signal RWL is brought into a high potential "1" to the time when the inverse read bit line signal BLB of a high potential "1" is outputted. At that time, the reading time of the worst cell is longer than the reading time of the typical cell.

The reading time of the replica block 6 is defined as a period of time from the time when the pre-word line signal WLP is brought into a high potential "1" to the time when the replica block 6 outputs the inverse read bit line signal BLB of a high potential "1". At that time, the reading time of the replica block 6 should be longer than the reading time of the slowest worst cell. The reading time of the replica block 6 is set to be longer than the reading time of the worst cell by setting a logical threshold value of the inverter 12 in the sense amplifier of the replica block 6 to be a small value.

Operation of the replica block 6 shown in FIG. 10 is as follows. The pre-word line signal WLP of a high potential "1" is inputted to the read word line of the replica SRAM cell and the NAND circuit 14 of the logic circuit. The output of the NAND circuit 14 passes through the inverter 15, and the second pre-word line signal WLP2 is brought into a high potential "1". In the replica SRAM cell, the access transistor N3 is brought into conduction so that the potential of the read bit line RBL which has been pre-charged into a high potential "1" is gradually lowered. When the potential of the read bit line RBL becomes lower than the logical threshold value of the inverter 12, the inverter 12 inverses the signal so that the output BLB of the inverter 12 has a high potential "1". However, since the logical threshold value of the inverter 12 is set at a small value, its inverse time is later than the inverse time of the worst cell. The data BLB from the inverter 12 are inputted into the logic circuit, and the second pre-word line signal WLP2 is brought into a low potential "0" via the inverter 13, the NAND circuit 14, and the inverter 15. Accordingly, the pulse width of the second pre-word line signal WLP2 is set to be equal to a period of time required for reading from the rise time of the read word line to the reading completion time.

FIG. 12 shows operation waveforms in a reading operation in which the pulse width of the read word line is set to be equal to the reading time of the replica block. The operation will be described with reference to FIGS. 9 and 12.

A clock signal is inputted to the control block 5, which outputs a pre-word line signal WLP. The replica block 6 generates, from the inputted pre-word line signal WLP, a second pre-word line signal WLP2 having a pulse width equal to a period of time required for reading of the replica SRAM cell. The main word driver 3 inverses the second pre-word line signal WLP2 inputted from a driver selected by an address signal and outputs the inversed signal as an inverse word line signal WLB to the sub-word driver of the block 2. Furthermore, a word line is selected in the sub-word driver so as to activate one read word line RWL. The read bit line RBL connected to the activated memory cell reads "0" on the storage node V1, which is inversed into an inverse bit line signal BLB by the inverter 12 of the sense amplifier. The output of the sense amplifier is transmitted to the Y-decoder and data circuit 4 as a read data line signal RDL.

The read word line signal RWL and the inverse word line signal BLB of the SRAM cell generally have the same activation width of the pulse width as the pre-word line signal WLP. Accordingly, the reading time and a period of time during which the holding control transistor N5 is cut off are equivalent to the pulse width of the pre-word line signal WLP.

However, in this example, the reading completion time of the memory cell is detected by the replica circuit, and the pulse widths of the inverse word line signal WLB and the read word line signal RWL are set to be a minimum required time for reading. Accordingly, the off time of the holding control transistor N5 is set to be short, and the retention time of the storage node V2 becomes larger than the off time of the holding control transistor N5. The reading operation is completed before the potential "0" of the storage node V2 is increased to the threshold voltage of the drive transistor N1. The holding control transistor N5 is turned on. Thus, a normal reading operation is performed.

FIG. 13 shows a replica block including two multiplexed replica circuits. In this example, the reading time of the replica circuits are designed to be longer than the reading time of the worst cell. However, when the reading time of a replica circuit becomes short due to influences of variations, the worst cell may malfunction. Accordingly, by multiplexing replica circuits and selecting a replica cell that operates the slowest, it is possible to reduce a possibility that the worst cell malfunctions due to variations.

The replica block shown in FIG. 13 has replica circuits 10-1 and 10-2. Inverse read bit line signals BLB1 and BLB2 from the respective replica circuits 10-1 and 10-2 are inputted to an NAND circuit 16. Subsequently, the output of the NAND circuit 16 and a pre-word line signal WLP are inputted to an NAND circuit 14. An inverter 15, to which the output of the NAND circuit 14 is inputted, outputs a second pre-word line signal WLP2.

Comparing to the replica block shown in FIG. 10, the replica block in this example is doubled as having the replica circuits 10-1 and 10-2, and the inverter 13 shown in FIG. 10 is changed to the two-input NAND circuit 16 in FIG. 10. Each of the replica circuits 10-1 and 10-2 is the same as the aforementioned replica circuit 10. The replica circuits 10-1 and 10-2 output inverse read bit line signals BLB1 and BLB2, respectively. The NAND circuit 16 outputs "0" when both of the two replica circuits 10-1 and 10-2 have completed a reading operation. Accordingly, when the replica circuit is doubled, the pulse width can be determined by the reading time of a slower replica circuit.

As described above, the pulse widths of the read word line signal RWL and the inverse word line signal WLB are set to be equal to a period of time required for the replica block to read from the SRAM cell. With such an arrangement, the holding control transistor N5 in the SRAM cell returns to an on state at the time of completion of reading from the SRAM cell. The two inverter circuits in the SRAM cell are connected with a loop and held in a stable holding state. When the cut-off time of the holding control transistor N5 is shortened, the holding control transistor N5 is turned on before the potential of "0" of the storage node V2 is increased to the threshold voltage of the drive transistor N1. Thus, a reading operation is normally performed. In other words, a reading operation is normally performed when the cut-off time of the holding control transistor N5 is set to be shorter than the retention time of the storage node V2.

In this example, the reading completion time is detected by the replica circuit. The pulse width of the inverse word line signal WLB is set to be equal to a period of time required for reading. The period of the pulse width is set as an activation period of the read word line signal RWL and as a period during which the holding control transistor is turned off. By minimizing the off period of the holding control transistor, it is possible to prevent the storage nodes from inversing and perform a normal reading operation. With such a configuration, it is possible to obtain an SRAM cell and a semiconductor memory device capable of operation at a high speed.

SECOND EXAMPLE

A second example will be described with reference to FIGS. 14A, 14B, and 15A to 15C. In the second example, a leakage current of the storage node V2 is controlled in a reading operation so as to hold data of the storage node V2. The level of a low potential "0" of the inverse word line signal WLB, which is a control signal for the holding control transistor N5 in the SRAM cell, is set to be 0.1V to 0.2V higher than the ground potential GND so as to increase a leakage current Ioff_N5 of the transistor N5. In this manner, a leakage current of the storage node V2 is set to have the relationship of Ioff_N4+Ioff_N5>>Ioff_P2. Thus, stored data are held.

Figure 14A:
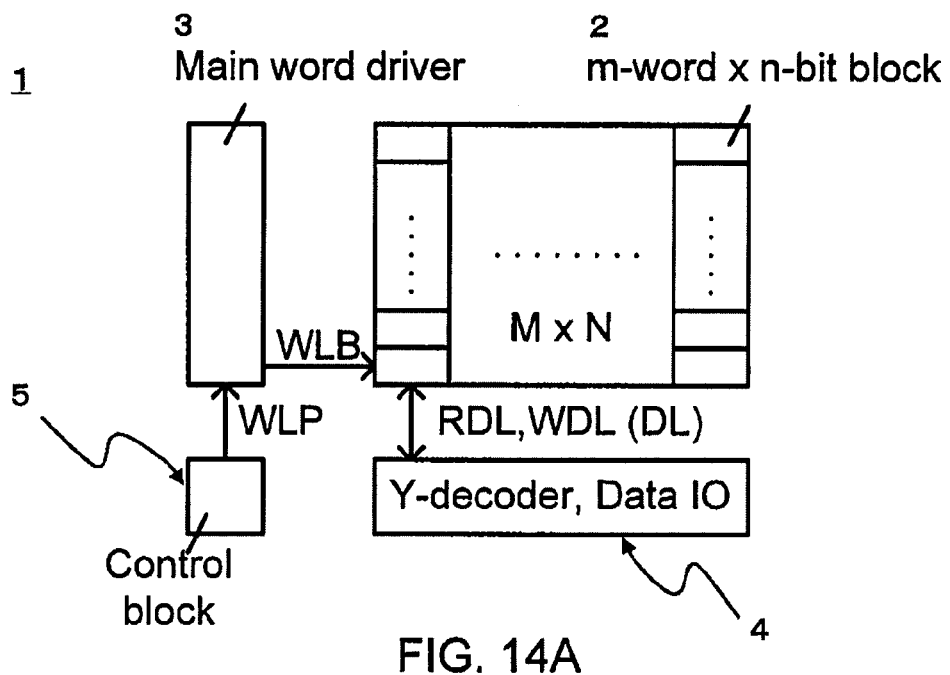
FIGS. 14A and 14B are diagrams explanatory of a flow of signals between blocks in a second example of the present invention.
Figure 14B:
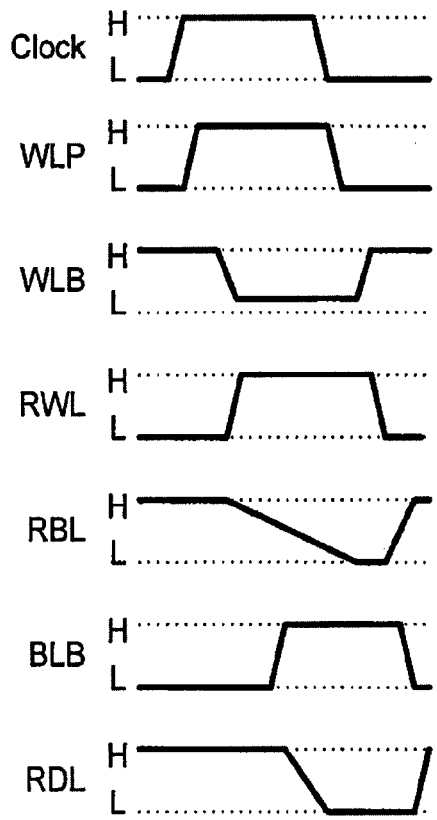

A flow of signals between blocks will be described with reference to FIGS. 14A and 14B. FIG. 14A shows a block arrangement explanatory of a flow of signals, and FIG. 14B shows operation waveforms. In the semiconductor memory device 1, blocks 2 each having an SRAM cell of m words and n bits are arranged as a cell array in the form of an M×N matrix. Each block has a sub-word driver and a sense amplifier (not shown). The semiconductor memory device is formed by a main word driver 3, a Y-decoder and data circuit 4, and a control block 5 into which a clock signal and other control signals are inputted.

A pre-word line signal WLP from the control block 5 to which a clock signal and other control signals are inputted is inputted into the main word driver 3. The main word driver 3 inputs an inverse word line signal WLB, which is selected by the inputted pre-word line signal WLP and an address signal, to the sub-word driver in the memory block 2. The sub-word driver activates a read word line signal RWL selected by the inverse word line signal WLB from the main word driver 3 and a block select signal. Data of the accessed SRAM cell pass through the read bit line RBL, then are inversed into an inverse bit line signal BLB by the sense amplifier, are further inversed into a read data line signal, and are inputted to the Y-decoder and data circuit 4. The inverse word line signal WLB from the main word driver 3 is inputted to the sub-word drivers and also inputted to the gate of the holding control transistor N5 in the SRAM cell so as to control the operation of the holding control transistor N5. A low potential "0" of the inverse word line signal WLB is set to be a low potential VS1 higher than the ground potential. With the low potential VS1 higher than the ground potential, a leakage current of the access transistor N4 is increased in a reading operation.

Figure 15A:
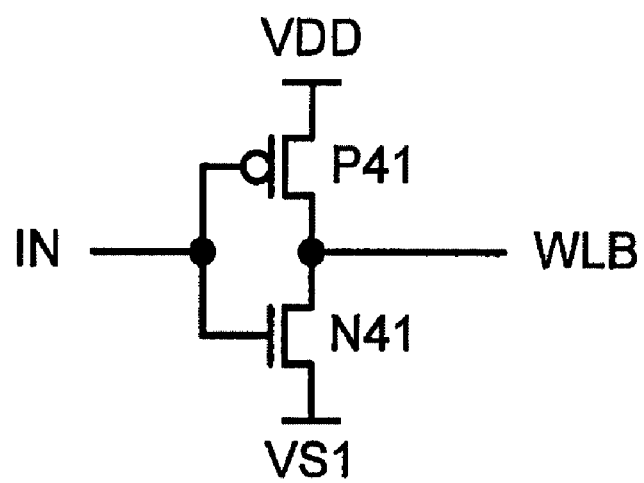
Figure 15B:
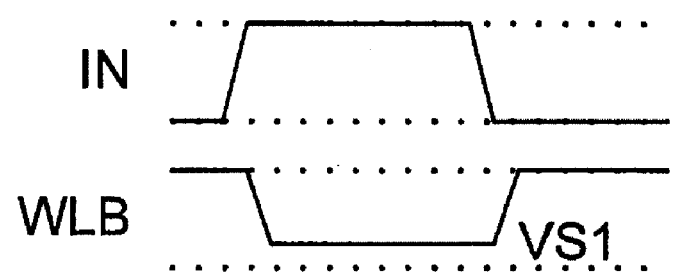
Figure 15C:
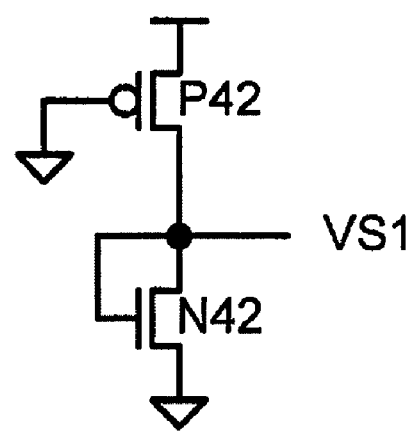

FIGS. 15A to 15C are diagrams explanatory of an output stage of the main word driver. FIG. 15A is a circuit diagram of the output stage of the main word driver, FIG. 15B shows operation waveforms of the main word driver, and FIG. 15C shows a generation circuit for a low potential VS1 in the output stage of the main word driver. The output stage of the main word driver is an inverter circuit including a PMOS transistor P41 and an NMOS transistor N41 disposed between a high power source VDD and a low power source VS1. An input signal IN is a signal resulting from logical operation of a pre-word signal WLP from the control block 5 and an inputted address signal. The inverse word line signal WLB is outputted to only the selected main word line. As shown in FIG. 15B, the inverse word line signal WLB is outputted as having a signal potential of VDD for a high potential "1" and a signal potential of VS1 for a low potential "0".

The low potential generation circuit shown in FIG. 15C will be described as a circuit for generating a low potential VS1. The low potential generation circuit is formed by a PMOS transistor P42 and an NMOS transistor N42. A drain, a source, and a gate of the transistor P42 are connected to an output VS1, a power source VDD, and a ground potential GND, respectively. A drain, a source, and a gate of the transistor N42 are connected to the output VS1, the ground potential GND, and the output VS1. The transistor N42 is diode-connected, and the output VS1 becomes a threshold voltage of the transistor N42. At that time, when a current supply capability of the transistor P42 is set to be very small, the output VS1 can be set to be slightly higher than the ground potential. When the low potential "0" of the inverse word line signal WLB is set to be slightly higher than the ground potential GND, it is possible to increase a leakage current Ioff_N5 of the holding control transistor N5 in the SRAM cell. Leakage currents of the storage node V2 are set to have the relationship of Ioff_N4+Ioff_N5>>Ioff_P2, and stored data of the storage node V2 are held.

In the second example, the low potential "0" of the inverse word line signal WLB is set to be a low potential VS1 slightly higher than the ground potential GND. Accordingly, it is possible to increase an off-state leakage current Ioff_N5 of the holding control transistor N5 in the SRAM cell and set the leakage current of the storage node V2 to have the relationship of Ioff_N4+Ioff_N5>>Ioff_P2. With such a configuration, it is possible to obtain an SRAM cell and a semiconductor memory device capable of stably holding stored data of the SRAM cell, performing a normal reading operation, and operating at a high speed.

THIRD EXAMPLE

A third example will be described with reference to FIGS. 16A, 16B, 17A, and 17B. In the third example, an off-state leakage current of the access transistor N4 connected to the write bit line WBL in the SRAM cell is controlled to hold data of the storage node V2. At the time of reading from the SRAM cell, the write word line signal WWL has a low potential "0", so that the access transistor N4 is in an off state. In the third example, the level of a low potential "0" of the write word line signal WWL is set to be 0.1V to 0.2V higher than the ground potential GND so as to increase a leakage current Ioff_N4 of the access transistor N4. In this manner, a leakage current of the storage node V2 is set to have the relationship of Ioff_N4+Ioff_N5>>Ioff_P2. Thus, stored data are held.

Figure 16A:
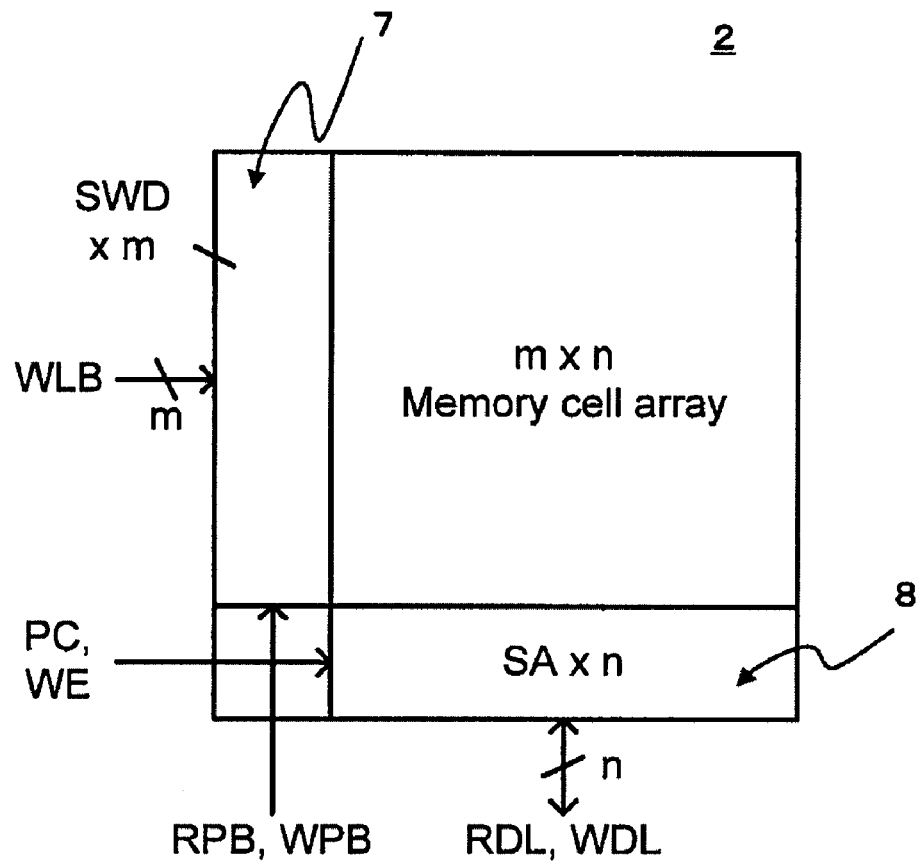
FIGS. 16A and 16B are diagrams showing an arrangement of a memory block (FIG. 16A) and a circuit of a sub-word driver (FIG. 16B) in a third example of the present invention.
Figure 16B:
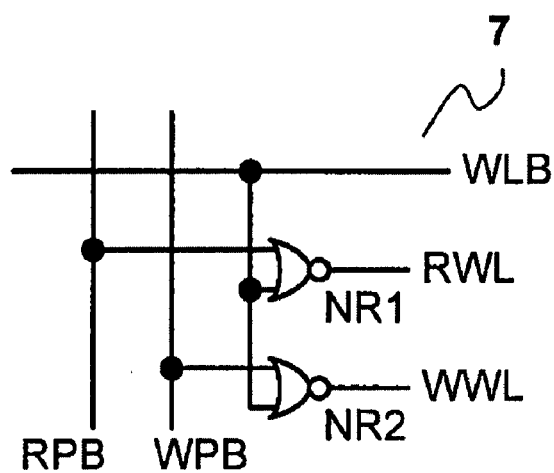
Figure 17A:
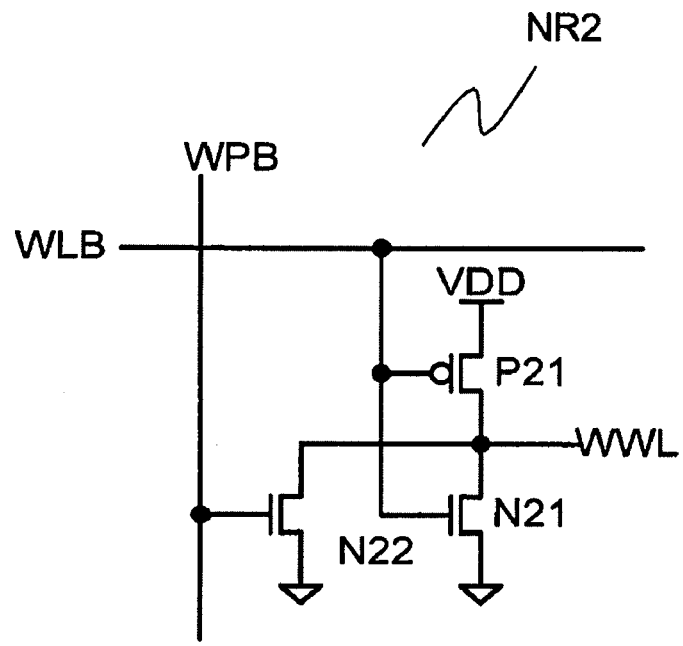
FIGS. 17A and 17B are diagrams showing a generation circuit for a write word line signal (FIG. 17A) and operation waveforms in a reading/writing operation (FIG. 17B) in the third example of the present invention.

FIG. 16A shows an arrangement of a block 2, and FIG. 16B shows a circuit of a sub-word driver. FIG. 17A shows a generation circuit for the write word line signal WWL, and FIG. 17B shows operation waveforms of the generation circuit.

The block 2 shown in FIG. 16A is formed by SRAM cells arranged in the form of a matrix having m rows and n columns. The block 2 also has m sub-word drivers 7 connected to word lines of the SRAM cells and n sense amplifiers 8 connected to bit lines of the SRAM cells. The sub-word driver 7 shown in FIG. 16B is formed by NOR circuits NR1 and NR2. The NOR circuit NR1 receives, as an input, the inverse word line signal WLB inputted from the main word driver and an inverse read block select signal RPB and outputs a read word line signal RWL. The NOR circuit NR2 receives, as an input, the inverse word line signal WLB inputted from the main word driver and an inverse write block select signal WPB and outputs a write word line signal WWL.

Figure 17B:
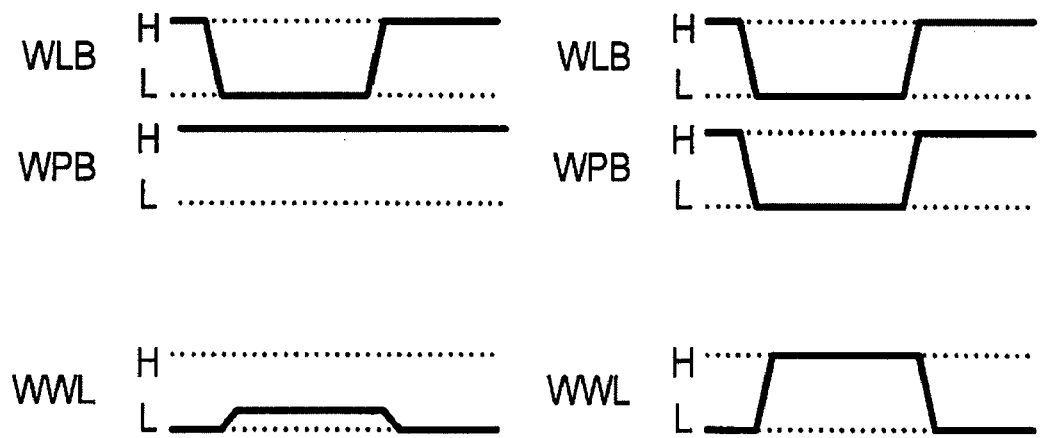

FIG. 17A shows the NOR circuit NR2 for generating the write word line signal WWL, and FIG. 17B shows its operation waveforms. The NOR circuit NR2 is formed by a PMOS transistor P21 and NMOS transistors N21 and N22. A drain, a source, and a gate of the transistor P21 are connected to the write word line signal WWL, the power source VDD, and the inverse word line signal WLB, respectively. A drain, a source, and a gate of the transistor N21 are connected to the write word line signal WWL, the ground potential GND, and the inverse word line signal WLB, respectively. A drain, a source, and a gate of the transistor N22 are connected to the write word line signal WWL, the ground potential GND, and the inverse write block select signal WPB, respectively.

A reading operation of the NOR circuit NR2 is illustrated on the left side of FIG. 17B, and a writing operation is illustrated on the right side of FIG. 17B. In the reading operation, the inverse word line signal WLB is brought into a low potential "0", and the inverse write block select signal WPB is set to have a high potential "1". The transistors P21 and N22 are turned on, and the transistor N21 is turned off. The low potential "0" of an output of the write word line signal WWL is determined by resistance division of the transistors P21 and N22. The drive capacity ratio of the transistors P21 and N22 is set so that the low potential "0" of the write word line signal WWL is not the ground potential GND but a potential of 0.1V and 0.2V. When the low potential "0" of the write word line signal WWL is set to be a potential of 0.1V and 0.2V, a leakage current Ioff_N4 of the access transistor N4 can be increased in the reading operation. Thus, a leakage current of the storage node V2 is set to have the relationship of Ioff_N4+Ioff_N5>>Ioff_P2.

In the writing operation, the inverse word line signal WLB is brought into a low potential "0", and the inverse write block select signal WPB is also brought into a low potential "0". The transistor P21 is turned on, the transistors N21 and N22 are turned off. The write word line signal WWL is brought into a high potential "1" by the transistor P21. Furthermore, when the SRAM cell is not accessed, both of the inverse word line signal WLB and the inverse write block select signal WPB have a high potential "1". The transistors P21 is turned off, and the transistors N21 and N22 are turned on. Accordingly, the write word line signal WWL has a low potential "0".

In the third example, the low potential "0" of the write word line signal WWL in the reading operation is set to be slightly higher than the ground potential GND. Accordingly, it is possible to increase an off-state leakage current Ioff_N4 of the access transistor N4 in the SRAM cell and set the leakage current of the storage node V2 to have the relationship of Ioff_N4+Ioff_N5>>Ioff_P2. With such a configuration, it is possible to obtain an SRAM cell and a semiconductor memory device capable of stably holding stored data of the SRAM cell, performing a normal reading operation, and operating at a high speed.

FOURTH EXAMPLE

A fourth example will be described with reference to FIGS. 18A to 18C. In the fourth example, although a leakage current of the access transistor N4 is increased as with the third example, it is different from the third example in implementation means. In the fourth example, the low potential "0" of the inverse write block select signal WPB is set to be an intermediate potential and inputted into the sub-word driver so that the low potential "0" of the write word line signal WWL is set to be 0.1V to 0.2V. The low potential "0" of the write word line signal WWL is set to be 0.1V to 0.2V higher than the ground potential GND so as to increase a leakage current Ioff_N4 of the access transistor N4. In this manner, a leakage current of the storage node V2 is set to have the relationship of Ioff_N4+Ioff_N5>>Ioff_P2. Thus, stored data are held.

Figure 18A:
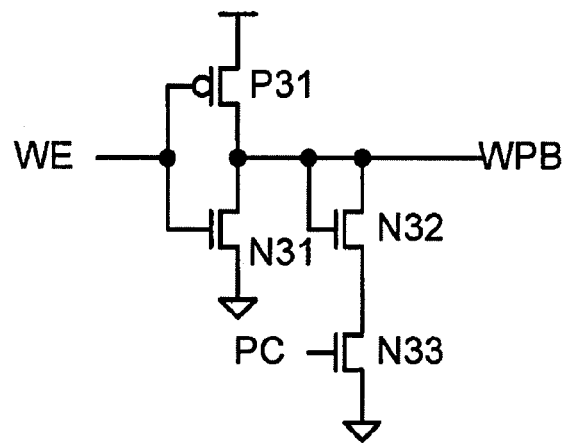
FIGS. 18A to 18C are a WPB generation circuit diagram (FIG. 18A), a principle diagram (FIG. 18B), and an operation waveform diagram (FIG. 18C) in a fourth example of the present invention.
Figure 18B:
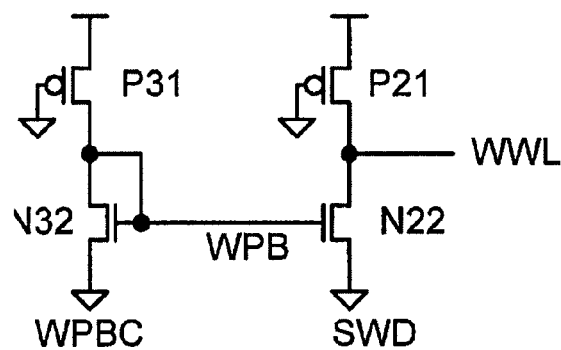
Figure 18C:
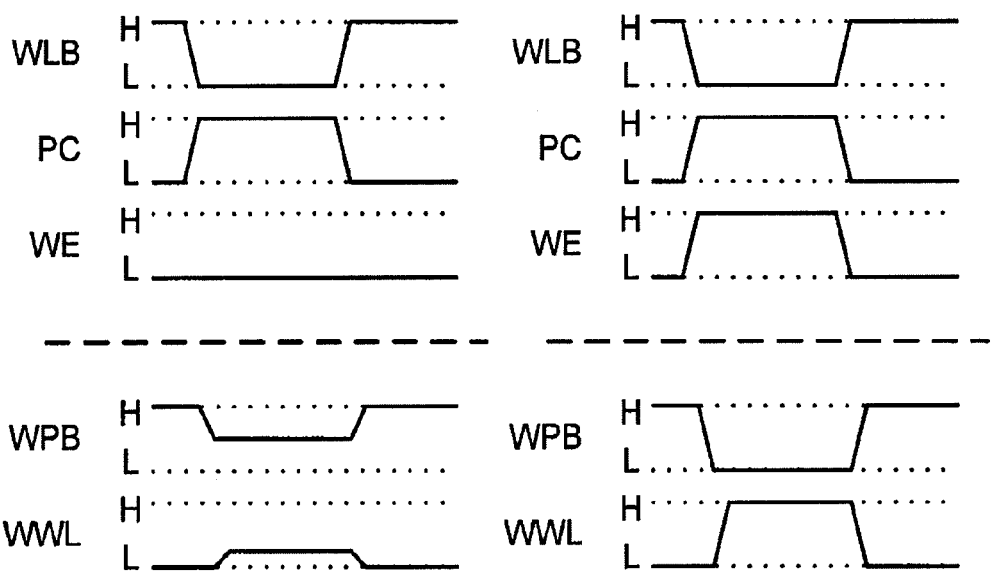

FIG. 18A shows a generation circuit for an inverse write select block signal WPB, FIG. 18B shows a principle diagram in which a WPB generation circuit and a sub-word driver are combined with each other, and FIG. 18C shows its operation waveforms.

The generation circuit for an inverse write select block signal WPB shown in FIG. 18A is formed by a PMOS transistor P31 and NMOS transistors N31, N32, and N33. A drain, a source, and a gate of the transistor P31 are connected to the inverse write select block signal WPB, a power source VDD, and a write enable signal WE, respectively. A drain, a source, and a gate of the transistor N31 are connected to the inverse write select block signal WPB, the ground potential GND, and the write enable signal WE, respectively. A drain, a source, and a gate of the transistor N32 are connected to the inverse write select block signal WPB, a drain of the transistor N33, and the inverse write select block signal WPB, respectively. A drain, a source, and a gate of the transistor N33 are connected to the source of the transistor N32, the ground potential GND, and a pre-charge signal PC, respectively.

Operation of the aforementioned generation circuit will be described with reference to FIG. 18C. FIG. 18C shows waveforms in a reading operation leftward and waveforms in a writing operation rightward. In the reading operation, the inverse word line signal is brought into a low potential "0", the pre-charge signal PC is brought into a high potential "1", and the write enable signal WE is maintained at a low potential "0". The transistor N33 is turned on by the high potential "1" of the pre-charge signal PC. The inverse write block select signal WPB is pulled down to a low potential "0" by the transistors N32 and N33. At that time, the low potential of the inverse write block select signal WPB is brought into a threshold voltage Vth (0.3V) of the transistor N32 because the gate and drain of the transistor N32 are connected to each other. The low potential of the inverse write block select signal WPB is inputted to the NOR circuit NR2 (FIG. 17A) of the sub-word driver, so that the low potential "0" of the write word line signal WWL becomes 0.1V to 0.2V.

In the writing operation, the inverse word line signal is brought into a low potential "0", the pre-charge signal PC is brought into a high potential "1", and the write enable signal WE is brought into a high potential "1". The transistor P31 is turned off, and the transistor N31 and the transistor N33 are turned on. The inverse write block select signal WPB is pulled down to a low potential "0" of the ground potential GND. The write word line signal WWL is brought into a high potential "1". Thus, a writing operation is performed.

The generation of the write word line signal WWL in the writing operation will be described. FIG. 18B shows a schematic circuit structure in which the generation circuit for the inverse write select block signal WPB is connected to the NOR circuit NR2 of the sub-word driver and from which the off-state transistors are deleted. This circuit forms a current mirror so that a potential slightly higher than the ground potential can be outputted as a low potential "0" of the stable write word line signal WWL without any influence from variations of threshold voltages of the transistors. Preferable sizes of the transistors forming this circuit are as follows. It is desirable that the transistor P31 have a size Wp31 large enough to drive m transistors N22 of m sub-word drivers arranged. It is desirable that the transistor P21 have a size Wp21 large enough to drive n access transistors N4 of n SRAM cells arranged. The size of the transistor N32 is preferably ¼ to ½ of the size of the transistor P31. The size of the transistor N32 is preferably 1 to 2 times the size of the transistor P31. Furthermore, it is desirable that the channel length be longer than a channel length of a general transistor.

In the fourth example, the low potential "0" of the write word line signal WWL in the reading operation is set to be slightly higher than the ground potential GND. Accordingly, it is possible to increase an off-state leakage current Ioff_N4 of the access transistor N4 in the SRAM cell and set the leakage current of the storage node V2 to have the relationship of Ioff_N4+Ioff_N5>>Ioff_P2. With such a configuration, it is possible to obtain an SRAM cell and a semiconductor memory device capable of stably holding stored data of the SRAM cell, performing a normal reading operation, and operating at a high speed.

FIFTH EXAMPLE

A fifth example will be described with regard to reduction of a leakage current of an SRAM cell formed by seven transistors. In the fifth example, a low power source potential as a source potential for two inverter circuits forming an SRAM cell is switched at the time of operation and at the time of holding data. At the time of holding data, the low power source potential is set to be higher than the ground potential so as to reduce a leakage current of the SRAM cell.

Reduction of a leakage current with an increased low power source potential in a conventional SRAM cell formed by six transistors is described in M. Yamaoka's "A 300 MHz 25 µA/Mb Leakage On-Chip SRAM Module Featuring Process-Variation Immunity and Low-Leakage-Active Mode for Mobile-Phone Application Processor," ISSCC2004 Digest, Feb. 18, 2004, pp. 494-495 (Non-patent Document 3). However, Non-patent Document 3 fails to disclose an SRAM cell having seven transistors or a generation method of a control signal.

A control method of a high power source potential VDD and a low power source potential GND in an SRAM cell will be described below with reference to FIGS. 19A and 19B.

Figure 19A:
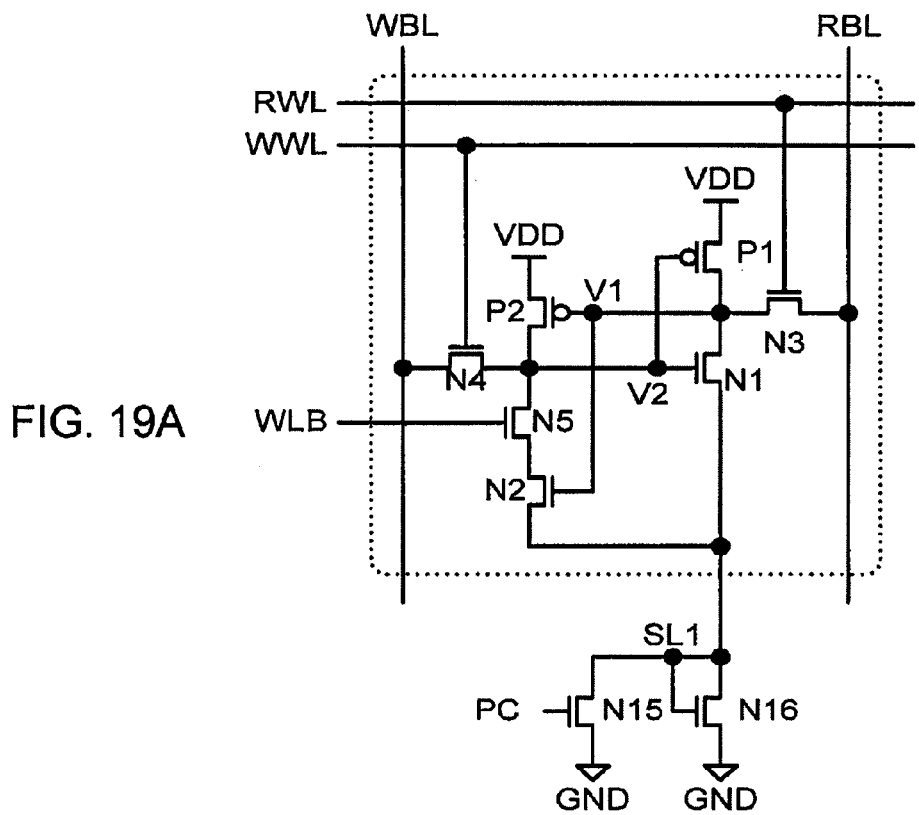
FIGS. 19A and 19B are a circuit diagram (FIG. 19A) and an operation waveform diagram (FIG. 19B) of an SRAM cell and a low potential switching portion in a fifth example of the present invention.
Figure 19B:
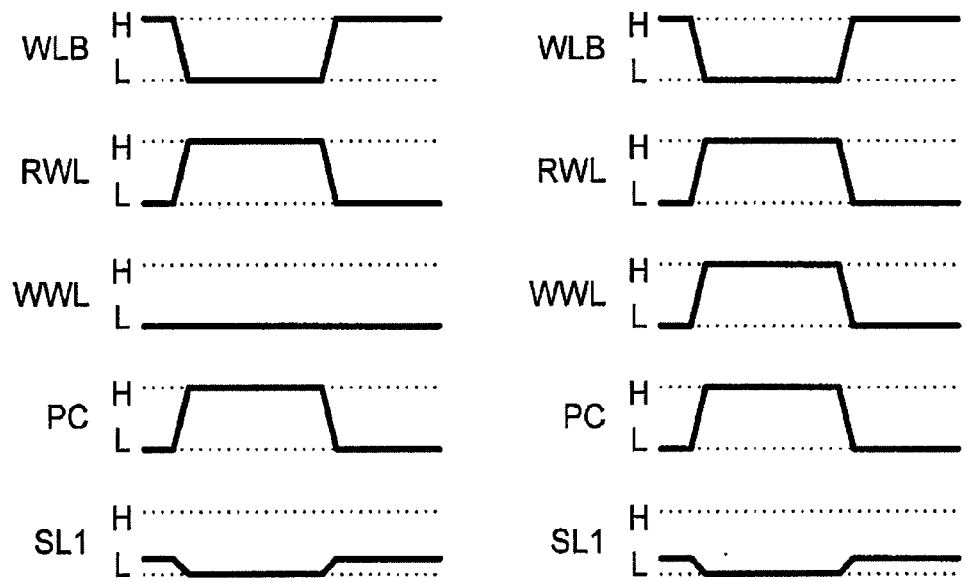

FIG. 19A shows a circuit diagram, in which the same parts as those in FIG. 5 are denoted by the same reference numerals, and the details thereof are omitted from the following description. FIG. 19B shows operation waveforms of signals in a reading operation leftward and operation waveforms of the signals in a writing operation rightward. In the circuit structure shown in FIG. 19A, sources of NMOS transistors N1 and N2 are connected in common to a node SL1 on a low power source potential side of the SRAM formed by seven transistors. NMOS transistors N15 and N16 are inserted and connected as a low potential switching portion between the node SL1 and the ground potential GND. A drain, a source, and a gate of the transistor N11 are connected to the node SL1, the ground potential GND, and a pre-charge signal PC, respectively. A drain, a source, and a gate of the transistor N16 are connected to the node SL1, the ground potential GND, and the node SL1, respectively, and thus diode-connected.

The operation waveforms shown in FIG. 19B will be described. In the reading operation (leftward in FIG. 19B), the inverse word line signal WLB is set to have a low potential "0", the read word line signal RWL is set to have a high potential "1", the write word line signal WWL is maintained at a low potential "0", the pre-charge signal PC is set to have a high potential "1". When the transistor N15 is turned on by the pre-charge signal PC, the node SL1 is brought into the ground potential GND. Accordingly, in the reading operation, a normal high power source potential VDD and ground potential GND are applied to the SRAM cell. Thus, a normal reading operation is performed.

In the writing operation (rightward), the inverse word line signal WLB is set to have a low potential "0", the read word line signal RWL is set to have a high potential "1", the write word line signal WWL is set to have a high potential "1", and the pre-charge signal PC is set to have a high potential "1". When the transistor N15 is turned on by the pre-charge signal PC, the node SL1 is brought into the ground potential GND. Accordingly, in the writing operation, a normal high power source potential VDD and ground potential GND are also applied to the SRAM cell. Thus, a normal writing operation is performed.

In a data holding state in which a reading/writing operation is not performed, the inverse word line signal WLB is set to have a high potential "1", the read word line signal RWL is set to have a low potential "0", the write word line signal WWL is set to have a low potential "0", and the pre-charge signal PC is set to have a low potential "0". When the transistor N15 is turned off by the pre-charge signal PC, the potential of the node SL1 is brought into a low potential Vssm higher than the ground potential. Here, the low potential Vssm is equal to a threshold voltage of the transistor N16 because the transistor N16 is diode-connected with its drain and gate being connected to the node SL1. For example, when the high power source potential VDD is 1V and the threshold voltage of the transistor N16 is 0.3V, the low potential Vssm is 0.3V. Thus, a power source potential difference is reduced to 0.7V.

When the node SL1 of the SRAM cell is increased from the ground potential so as to reduce a potential between the gate and the source of the access transistor, a leakage current of the transistor is reduced. Although the substrate potential of the drive transistor is connected to the ground potential GND, the source potential of the transistor is increased when the potential of the node SL1 becomes higher than the ground potential. When the source potential of the transistor is increased, the threshold voltage of the transistor is increased by the back-bias effect so as to reduce its leakage current. Furthermore, when the potential of the node SL1 becomes higher than the ground potential, a potential between the drain and the source of the load transistor is reduced so that its leakage current is slightly reduced. Thus, when the potential of the node SL1 in the SRAM cell becomes higher than the ground potential, it is possible to obtain an effect of reducing the leakage current of the SRAM cell.

In the fifth example, a low potential switching portion formed by the transistor N15 having a gate input of the pre-charge signal and the diode-connected transistor N16 is provided between the node SL1 of the SRAM cell and the ground potential. The potential of the node SL1 is brought into the ground potential in the reading and writing operations and into the low potential Vssm in the data holding state by the low potential switching portion. Accordingly, a leakage current can be reduced in the data holding state.

SIXTH EXAMPLE

Figure 20A:
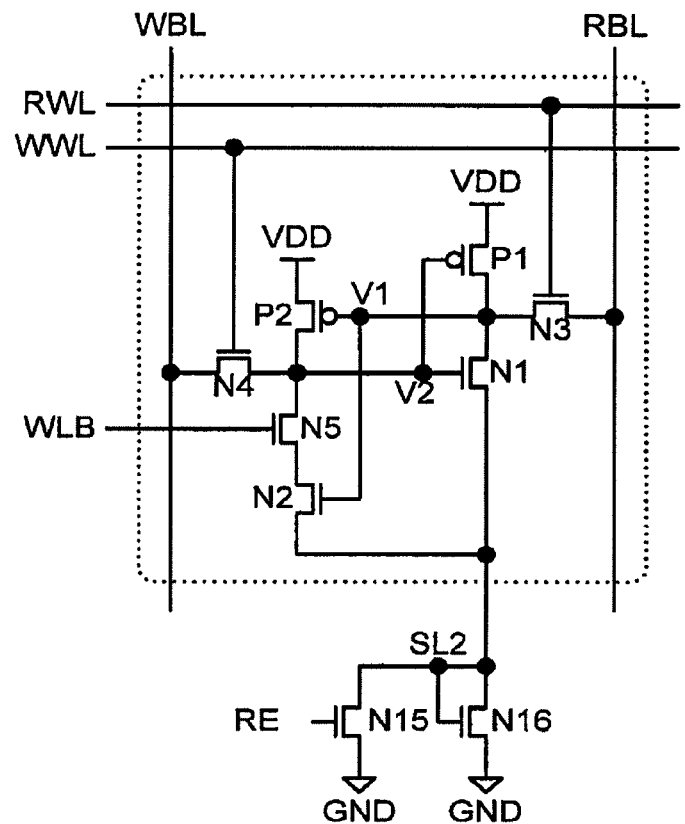
FIGS. 20A and 20B are a circuit diagram (FIG. 20A) and an operation waveform diagram (FIG. 20B) of an SRAM cell and a low potential switching portion in a sixth example of the present invention (first case).
Figure 20B:
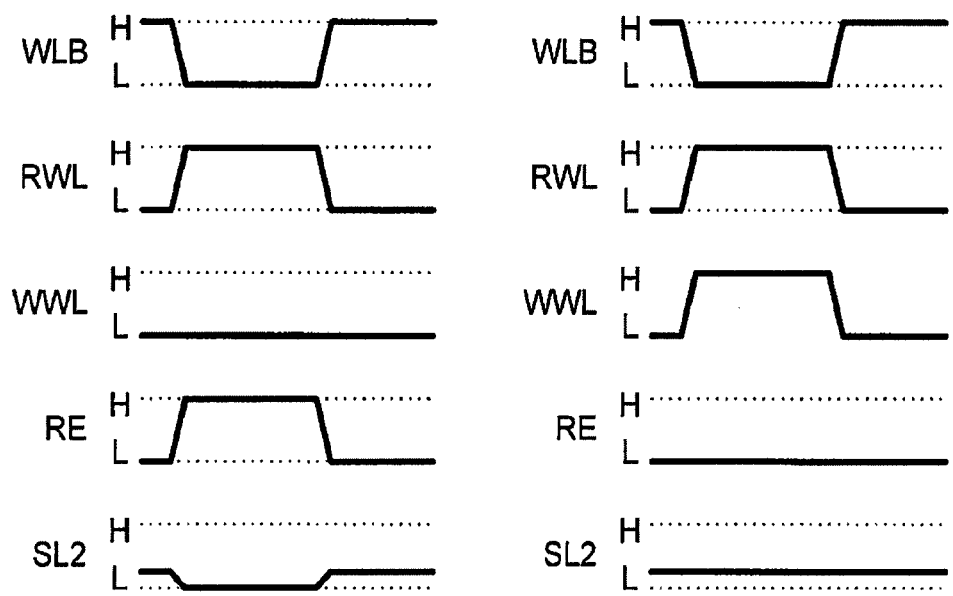

A sixth example will be described with regard to reduction of a leakage current of an SRAM cell, which is an improvement of the fifth example. In the sixth example, a low power source potential of an SRAM is switched at the time of reading/writing and at the time of holding data by a low potential switching portion. At the time of holding data, the low power source potential is set to be higher than the ground potential so as to reduce a leakage current of the SRAM cell. Furthermore, at the time of writing, the low power source potential is set to be higher than the ground potential so as to enlarge an operation margin in a writing operation. FIG. 20A shows a circuit diagram, and FIG. 20B shows operation waveforms of signals in reading and writing operations.

In the circuit structure shown in FIG. 20A, sources of transistors N1 and N2 are connected in common to a node SL2 on a low power source potential side of the SRAM formed by seven transistors. Transistors N15 and N16 are inserted and connected as a low potential switching portion between the node SL2 and the ground potential GND. The transistor N15 has a drain, a source, and a gate connected to the node SL2, the ground potential GND, and a read enable signal RE, respectively. The transistor N16 has a drain, a source, and a gate connected to the node SL2, the ground potential GND, and the node SL2, respectively.

The operation waveforms shown in FIG. 20B will be described. In the reading operation (leftward in FIG. 20B), the inverse word line signal WLB is set to have a low potential "0", the read word line signal RWL is set to have a high potential "1", the write word line signal WWL is maintained at a low potential "0", the read enable signal RE is set to have a high potential "1". When the transistor N15 is turned on by the read enable signal RE, the node SL2 is brought into the ground potential GND. Accordingly, in the reading operation, a normal high power source potential VDD and ground potential GND are applied to the SRAM cell. Thus, a normal reading operation is performed.

In the writing operation (rightward in FIG. 20B), the inverse word line signal WLB is set to have a low potential "0", the read word line signal RWL is set to have a high potential "1", the write word line signal WWL is set to have a high potential "1", and the read enable signal RE is set to have a high potential "0". The read enable signal RE is maintained at a low potential "0", and thus the transistor N15 is in an off state. The potential of the node SL2 becomes equal to a low potential Vssm determined by the transistor N16.

Here, a writing operation in a case where the node SL2 has a low potential Vssm will be described. There will be described a case where "1" is written in a state in which "0" is stored on the storage node V1. In the state in which "0" is stored on the storage node V1, the load transistor P2 and the drive transistor N1 are in an on state. However, the gate potential of the load transistor P2 is equal to the low potential Vssm, and the source potential of the drive transistor N1 is equal to the low potential Vssm. Thus, a voltage between the gate and the source of each of the load transistor P2 and the drive transistor N1 is so low, and the driving capacity is also small. Accordingly, the storage node V1 becomes likely to be inversed from "0" to "1", whereas the storage node V2 becomes likely to be inversed from "1" to "0". When the low potential is set to be the low potential Vssm, it is possible to readily perform a writing operation and enlarge an operation margin.

In a data holding state in which a reading/writing operation is not performed, the inverse word line signal WLB is set to have a high potential "1", the read word line signal RWL is set to have a low potential "0", the write word line signal WWL is set to have a low potential "0", and the read enable signal RE is set to have a low potential "0". When the transistor N15 is turned off by the read enable signal RE, the potential of the node SL2 is brought into a low potential Vssm higher than the ground potential. This state is the same as described in the fifth example. When the potential of the node SL2 in the SRAM cell becomes higher than the ground potential, it is possible to obtain an effect of reducing the leakage current of the SRAM cell.

Figure 21A:
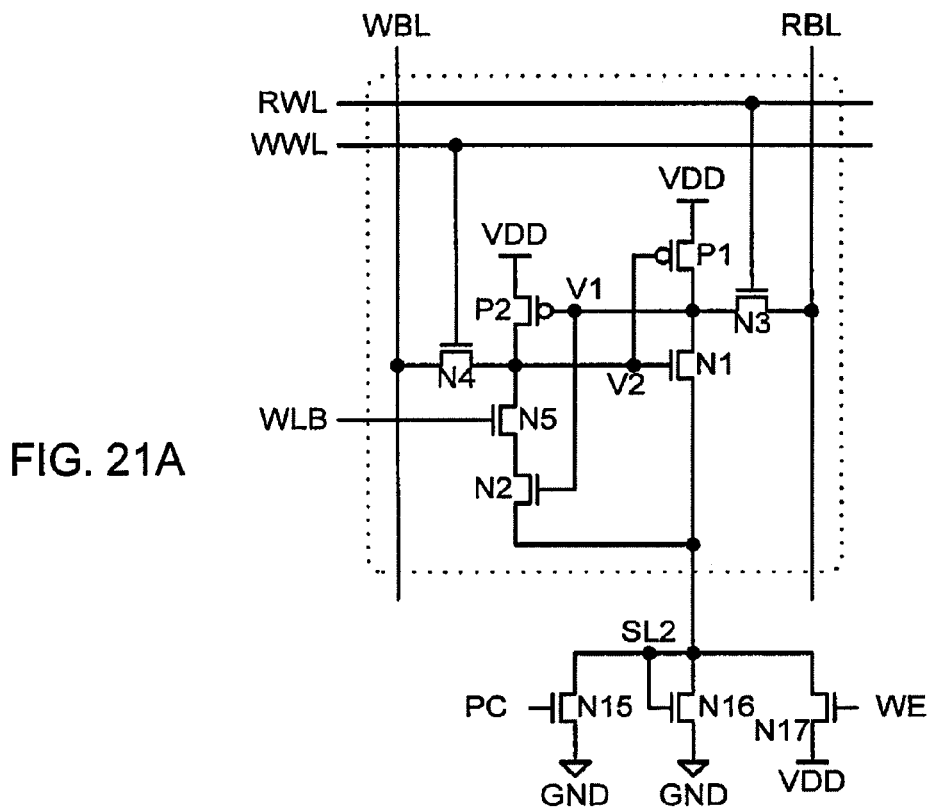
FIGS. 21A and 21B are a circuit diagram (FIG. 21A) and an operation waveform diagram (FIG. 21B) of an SRAM cell and a low potential switching portion in the sixth example of the present invention (second case).
Figure 21B:
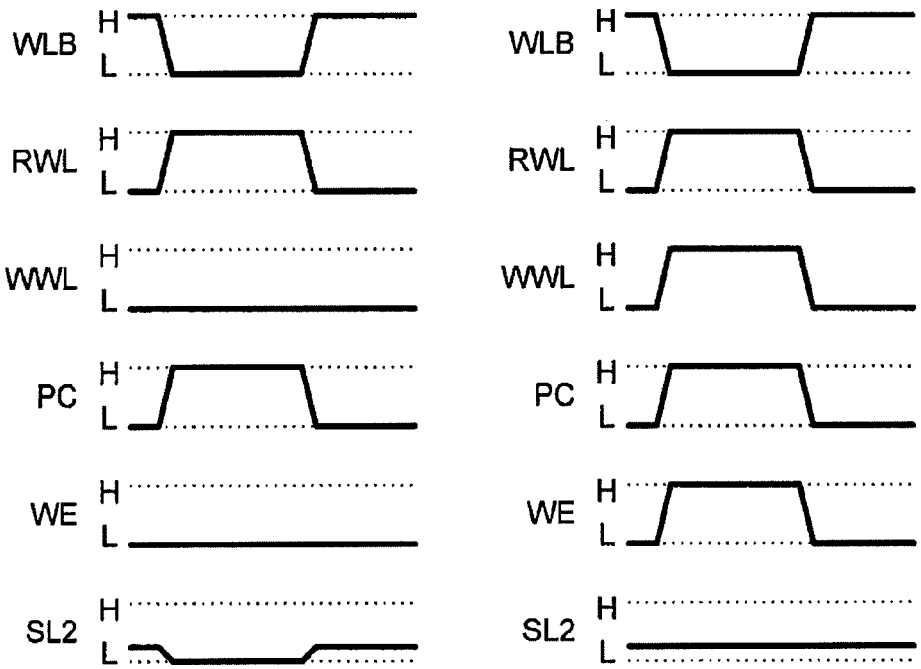

In this circuit structure, the potential of the node SL2 of the SRAM cell is brought into the low potential Vssm in the data holding state and in the writing operation and brought into the ground potential in the reading operation. FIGS. 21A, 21B, 22A, and 22B show other circuit structure examples of the low potential switching portion for the node SL2 in the SRAM cell. As shown in FIG. 21A, a transistor N15 having a gate input of a pre-charge signal PC and a diode-connected transistor N16 are inserted and connected as a low potential switching portion for the node SL2 between the node SL2 and the ground potential GND. Furthermore, a transistor N17 having a gate input of a write enable signal WE is inserted and connected between the node SL2 and the high power source potential VDD. This low potential switching portion is formed by adding the transistor N17 to the low potential switching portion in the fifth example (FIG. 19A). The added transistor N17 is turned on in a writing operation so as to increase the potential of the node SL2 up to a low potential Vssm.

Figure 22A:
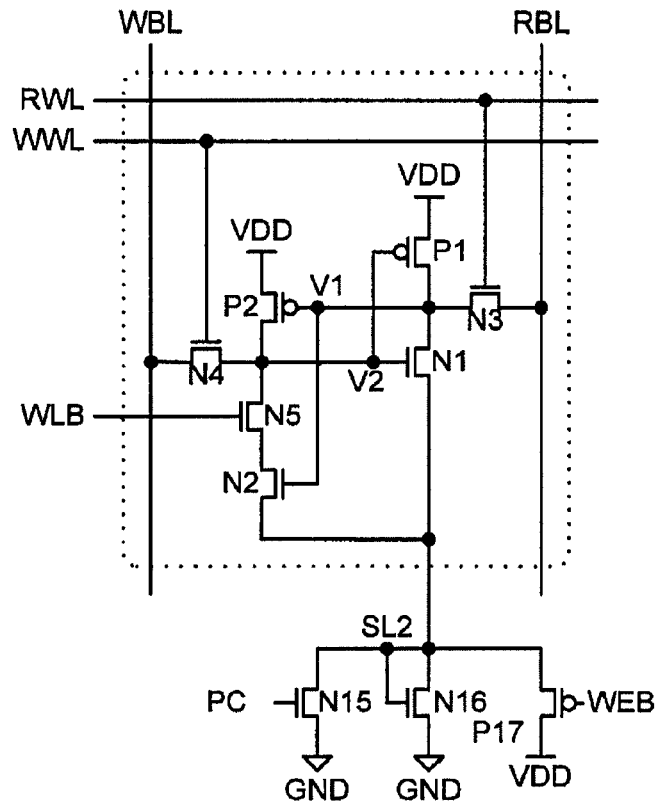
FIGS. 22A and 22B are a circuit diagram (FIG. 22A) and an operation waveform diagram (FIG. 22B) of an SRAM cell and a low potential switching portion in the sixth example of the present invention (third case).
Figure 22B:
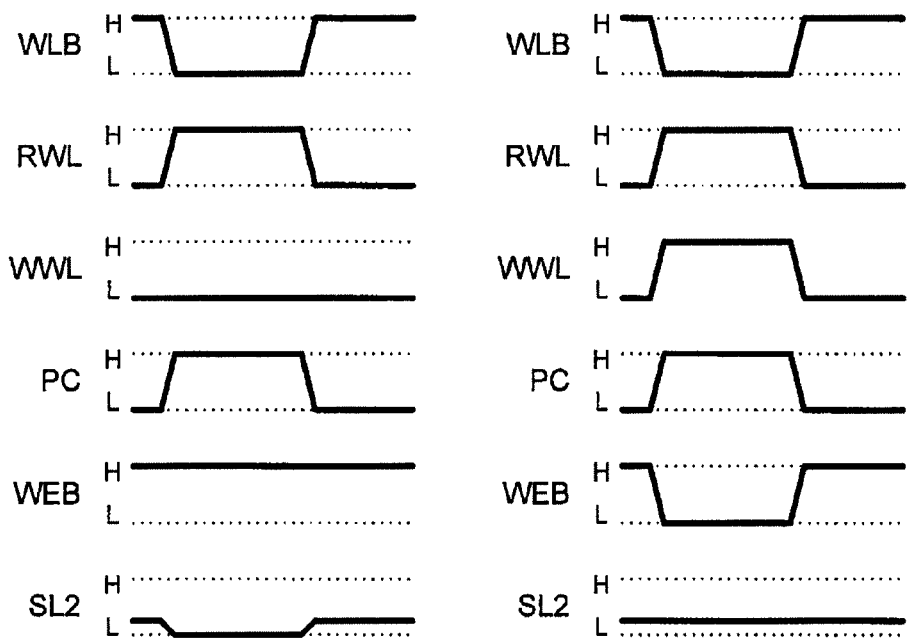

Meanwhile, in the low potential switching portion shown in FIG. 22A, a transistor N15 having a gate input of a pre-charge signal PC and a diode-connected transistor N16 are inserted and connected between the node SL2 and the ground potential GND. Furthermore, a transistor P17 having a gate input of an inverse write enable signal WEB is inserted and connected between the node SL2 and a high power source potential VDD. This low potential switching portion is formed by adding the transistor P17 to the low potential switching portion in the fifth example (FIG. 19A). The added transistor N17 is turned on in a writing operation so as to increase the potential of the node SL2 up to a low potential Vssm.

In the arrangement shown in FIG. 21A, the potential of the node SL2 is determined by a resistance division ratio of the transistor N15 and the transistor N17. Accordingly, depending upon purposes, a proper value can be set for the low potential Vssm by adjusting the transistor N15 and the transistor N17. In the arrangement shown in FIG. 22A, the potential of the node SL2 is determined by a resistance division ratio of the transistor N15 and the transistor N17. In the arrangement shown in FIG. 21 or 22A, the potential of the node SL2 can forcibly be pulled up by adding the transistor N17 or the transistor P17. Accordingly, when this low potential switching portion is used in common for a plurality of memory cells, it is possible to obtain an effect of stabilizing the controllability.

With the arrangement shown in FIG. 21A or 22A, the potential of the node SL2 in the SRAM cell is brought into the low potential Vssm in the data holding state and in the writing operation and brought into the ground potential in the reading operation. Furthermore, it can readily be understood that the SRAM operates in accordance with the illustrated operation waveforms. Accordingly, explanation of the operations is omitted herein.

In this example, the low potential switching portion is provided between the node SL2 of the SRAM cell and the ground potential. The potential of the node SL2 is brought into the ground potential in the reading operation and brought into the low potential Vssm in the writing operation and in the holding state by the low potential switching portion. Accordingly, it is possible to reduce a leakage current in the data holding state and enlarge an operation margin in the writing operation.

SEVENTH EXAMPLE

Figure 23A:
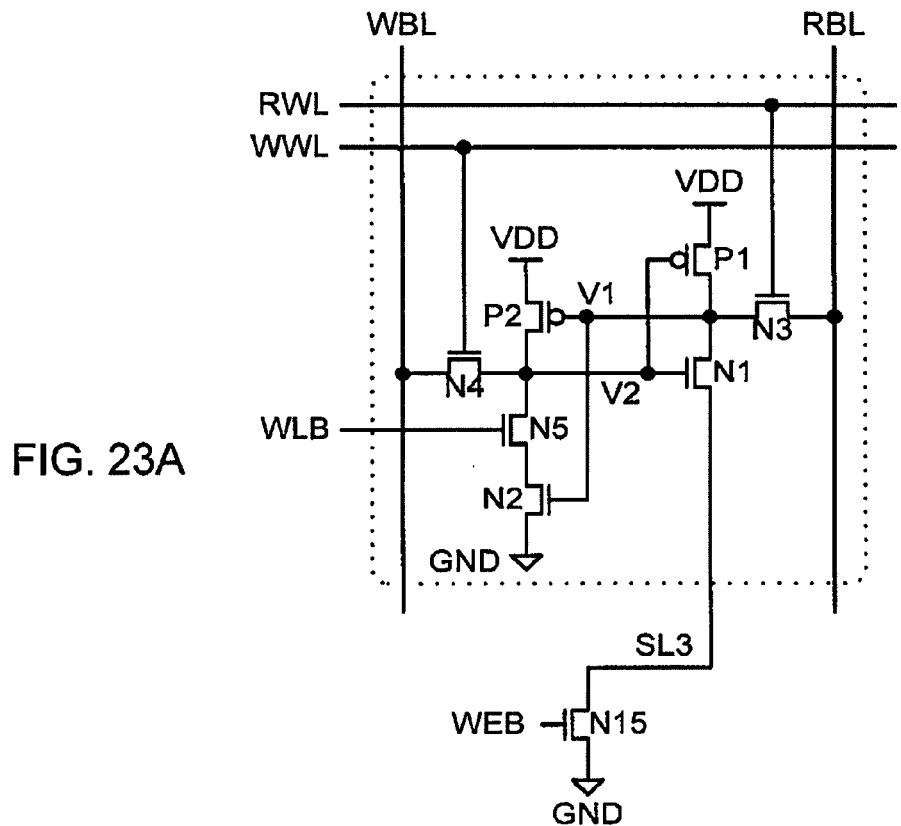
FIGS. 23A and 23B are a circuit diagram (FIG. 23A) and an operation waveform diagram (FIG. 23B) of an SRAM cell and a low potential switching portion in a seventh example of the present invention.
Figure 23B:
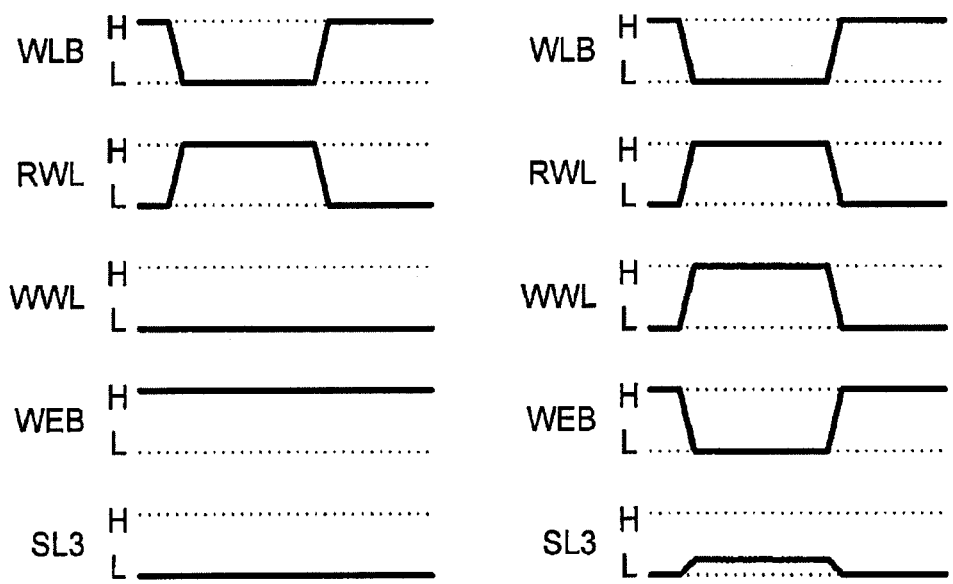

A seventh example will be described with reference to FIGS. 23A and 23B. In the seventh example, a node SL3 in an SRAM cell is brought into a ground potential GND in a reading operation and in a data holding state by a low potential switching portion. Connection between the node SL3 and a low power source potential is disconnected in a writing operation for causing a floating state, thereby enlarging an operation margin in the writing operation. FIG. 23A shows a circuit, and FIG. 23B shows operation waveforms of signals in a reading operation (leftward) and in a writing operation (rightward).

In the circuit structure shown in FIG. 23A, a source of a transistor N1 is connected to the node SL3 on a low power source potential side of the SRAM formed by seven transistors. A transistor N15 is inserted and connected as a low potential switching portion between the node SL3 and the ground potential GND. The transistor N15 has a drain, a source, and a gate connected to the node SL3, the ground potential GND, and an inverse write enable signal WEB, respectively.

The operation waveforms shown in FIG. 23B will be described. In the reading operation (leftward in FIG. 23B), the inverse word line signal WLB is set to have a low potential "0", the read word line signal RWL is set to have a high potential "1", the write word line signal WWL is maintained at a low potential "0", and the inverse write enable signal WEB is set to have a high potential "1". The inverse write enable signal WEB is maintained at a high potential "1" so that the transistor N15 is in an on state. The node SL3 have the ground potential GND.

In the writing operation (rightward in FIG. 23B), the inverse word line signal WLB is set to have a low potential "0", the read word line signal RWL is set to have a high potential "1", the write word line signal WWL is set to have a high potential "1", and the inverse write enable signal WEB is set to have a low potential "0". Since the inverse write enable signal WEB is brought into a low potential "0", the transistor N15 is turned off so that the node SL3 is maintained at a low potential "0" and in a floating state. In this floating state, there will be described a writing operation in a case where "1" and "0" are written into the storage node V1 and the storage node V2, respectively, inversely from a state in which "0" and "1" are stored on the storage node V1 and the storage node V2, respectively.

The potential of the storage node V1 is to be pulled up from a low potential "0" to a high potential "1" of the read bit line RBL via the access transistor N3. However, the potential of the storage node V1 is not increased above a certain potential due to the on-state drive transistor N1. However, the transistor N15 is turned off, and the node SL3 is maintained at a low potential "0" in the floating state. Accordingly, the potential of the node SL3 is gradually increased from the ground potential GND by a current flowing from the read bit line RBL. The storage node V1 is similarly increased. Thus, a voltage between the gate and the source of each of the load transistor P2 and the drive transistor N1 is so low, and the driving capacity is also small. Therefore, the storage node V1 becomes likely to be inversed from "0" to "1", whereas the storage node V2 becomes likely to be inversed from "1" to "0". An operation margin is enlarged. When the writing operation is completed, the gate of the drive transistor N1 has a level of "0" so that the drive transistor N1 is in a complete off state. Then, the potential of the node SL3 is returned to the ground potential by the transistor N15.

Furthermore, in an opposite case where "0" and "1" are written into the storage node V1 and the storage node V2, respectively, the gate voltage of the drive transistor N1 is increased from "0" to "1", whereas the drain voltage is lowered from "1" to "0". At that time, a writing operation is performed while the potential of the node SL3 is hardly changed from the ground potential GND.

In a data holding state in which a reading/writing operation is not performed, the inverse write enable signal WEB is set to have a high potential "1" so as to turn the transistor N15 on. The potential of the node SL3 is brought into the ground potential GND.

In the seventh example, the low potential switching portion is provided between the node SL3 of the SRAM cell and the ground potential. The potential of the node SL3 is brought into the ground potential in the reading operation and in the data holding state, and the node SL3 is disconnected from the ground potential in the writing operation so as to be in a floating state. Thus, it is possible to enlarge an operation margin in the writing operation by disconnecting the node SL3.

EIGHTH EXAMPLE

Figure 24A:
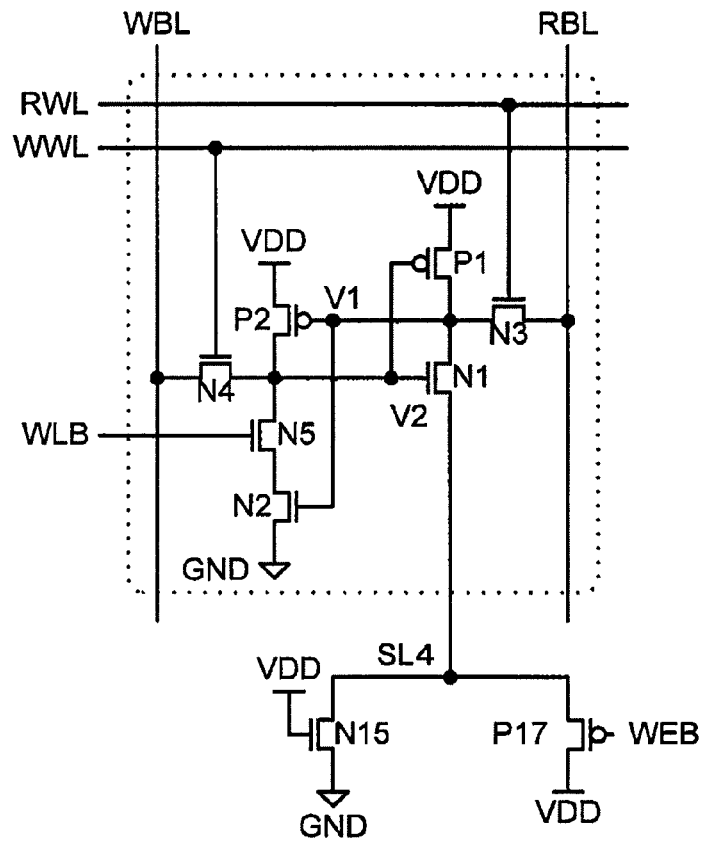
FIGS. 24A and 24B are a circuit diagram (FIG. 24A) and an operation waveform diagram (FIG. 24B) of an SRAM cell and a low potential switching portion in an eighth example of the present invention (first case).

An eighth example will be described with reference to FIGS. 24A, 24B, 25A, and 25B. In the eighth example, a low potential switching portion is provided between a source node SL4 of a drive transistor N1 in an SRAM cell formed by seven transistors and a ground potential. A low power source potential of the SRAM cell is switched by the low potential switching portion. The low power source potential is brought into the ground potential in a reading operation and in a data holding state and brought into a low potential Vssm higher than the ground potential in a writing operation. A writing operation margin (WSNM) is enlarged by making the low power source potential higher than the ground potential in the writing operation. FIGS. 24A and 25A show circuits, and FIGS. 24B and 25B show operation waveforms of signals in reading and writing operations.

The low potential switching portion shown in FIG. 24A is formed by transistors N15 and P17. The transistor N15 has a drain, a source, and a gate connected to a node SL4, a ground potential GND, and a power source VDD, respectively. The transistor P17 has a drain, a source, and a gate connected to the node SL4, the power source VDD, and an inverse write enable signal WEB, respectively.

Figure 24B:
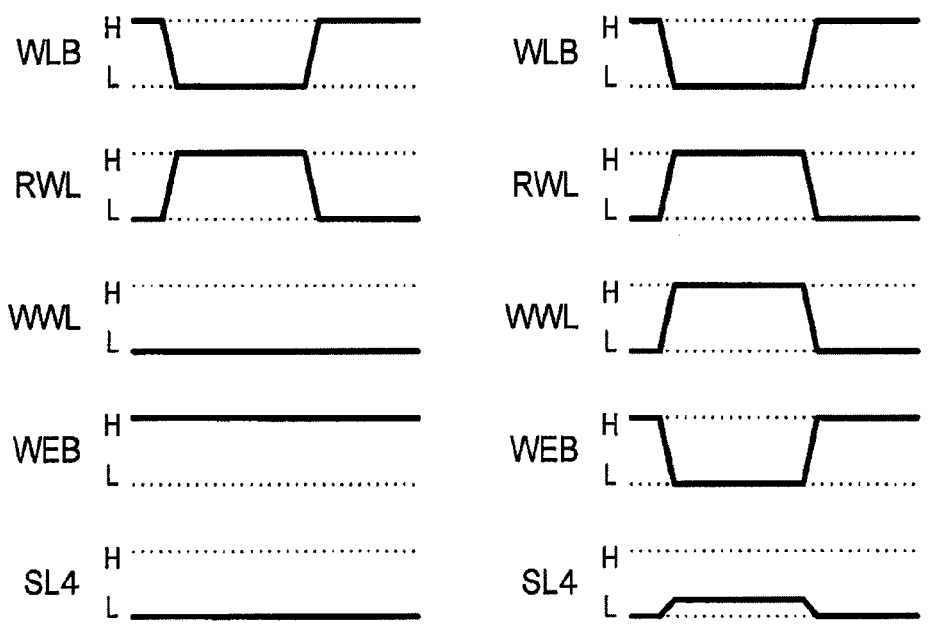
Figure 25A:
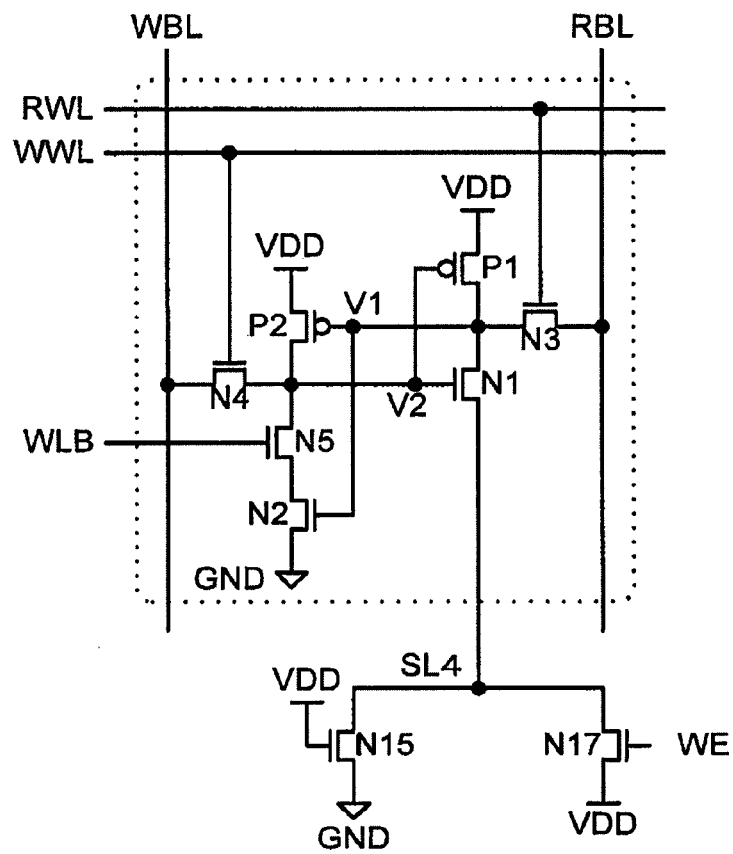
FIGS. 25A and 25B are a circuit diagram (FIG. 25A) and an operation waveform diagram (FIG. 25B) of an SRAM cell and a low potential switching portion in the eighth example of the present invention (second case).
Figure 25B:
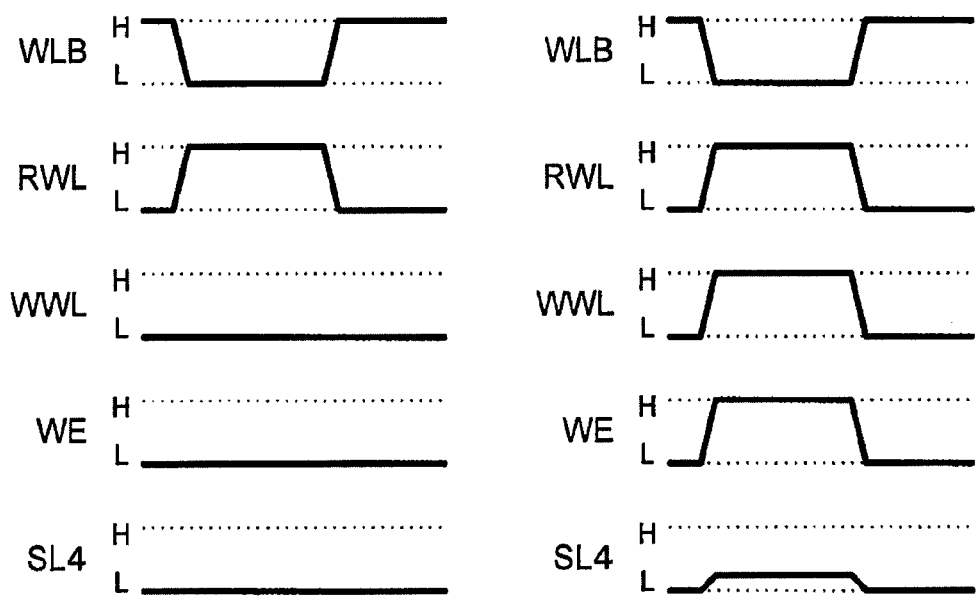

FIG. 24B shows operation waveforms of signals in a reading operation (leftward) and in a writing operation (rightward). The transistor N15 of the low potential switching portion is continuously in an on state and thus attempts to bring the node SL4 into the ground potential. In the data holding state or the reading operation in which the inverse write enable signal WEB has a high potential "1", the transistor P17 is in an off state. Accordingly, the potential of the node SL4 is brought into the ground potential GND. On the other hand, in the writing operation in which the inverse write enable signal WEB has a low potential "0", the transistor P17 is in an on state. Accordingly, the potential of the node SL4 is brought into a low potential Vssm determined by a resistance division ratio of the transistor P17 and the transistor N15.

The low potential switching portion shown in FIG. 25A is formed by transistors N15 and N17. The transistor N15 has a drain, a source, and a gate connected to a node SL4, a ground potential GND, and a power source VDD, respectively. The transistor N17 has a drain, a source, and a gate connected to the node SL4, the power source VDD, and a write enable signal WE, respectively. FIG. 25B shows operation waveforms of signals in a reading operation (leftward) and in a writing operation (rightward). The transistor N15 of the low potential switching portion is continuously in an on state and thus attempts to bring the node SL4 into the ground potential. In the data holding state or the reading operation in which the write enable signal WE has a low potential "0", the transistor N17 is in an off state. Accordingly, the potential of the node SL4 is brought into the ground potential GND. On the other hand, in the writing operation in which the write enable signal WE has a high potential "1", the transistor N17 is in an on state. Accordingly, the potential of the node SL3 [sic] is brought into a low potential Vssm determined by a resistance division ratio of the transistor N17 and the transistor N15.

In the seventh example shown in FIG. 23A, the potential of the node SL3 is increased only in a case where "1" and "0" are written into the storage node V1 and the storage node V2, respectively, inversely from a state in which "0" and "1" are stored on the storage node V1 and the storage node V2, respectively. In other cases, the potential of the node SL3 is maintained at the ground potential GND. Accordingly, if a plurality of nodes SL3 are integrated into one node in the memory cell array shown in FIG. 16A, then the node SL3 may not be increased from the ground potential GND. With the arrangement shown in FIGS. 24A and 25A, the potential of the node SL4 can forcibly be pulled up irrespective of write data. Therefore, when this low potential switching portion is used in common for a plurality of memory cells, it is possible to obtain an effect of stabilizing the controllability.

In the eighth example, the low potential switching portion is provided between the node SL4 of the SRAM cell and the ground potential. The potential of the node SL4 as a low power source potential of the SRAM cell is brought into the ground potential in the reading operation and in the data holding state and brought into the low potential Vssm higher than the ground potential in the writing operation by the low potential switching portion. Thus, it is possible to enlarge a writing operation margin (WSNM) by making the low power source potential higher than the ground potential in the writing operation.

In the fifth to eighth examples, when the transistor N15 is designed to be at least about 4 times as large as the transistor N1 or the transistor N3, it is possible to reduce a possibility that the low potential of the node is excessively increased. Accordingly, it is possible to further enhance the reliability of the aforementioned operation.

NINTH EXAMPLE

Figure 26A:
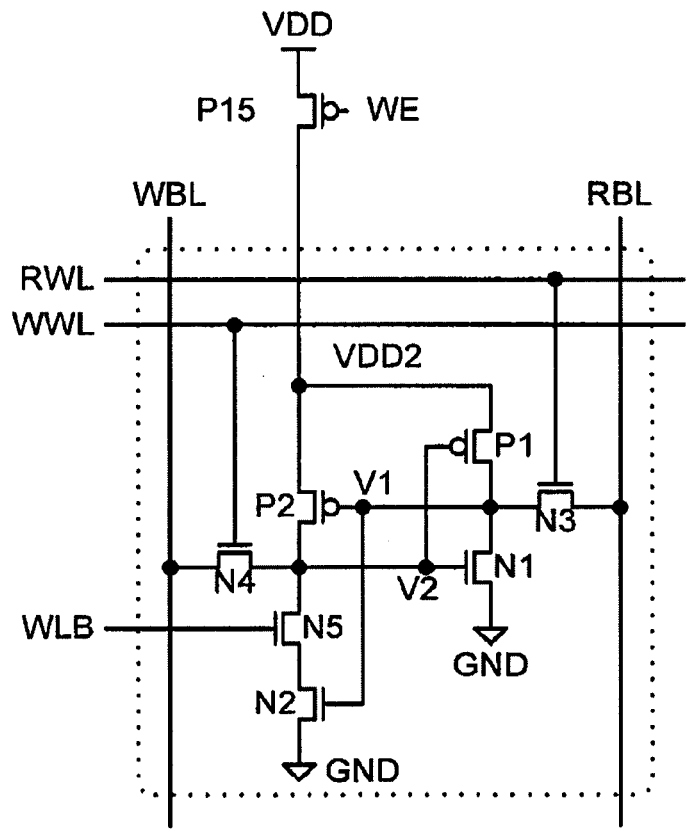
FIGS. 26A and 26B are a circuit diagram (FIG. 26A) and an operation waveform diagram (FIG. 26B) of an SRAM cell and a high potential switching portion in a ninth example of the present invention.
Figure 26B:
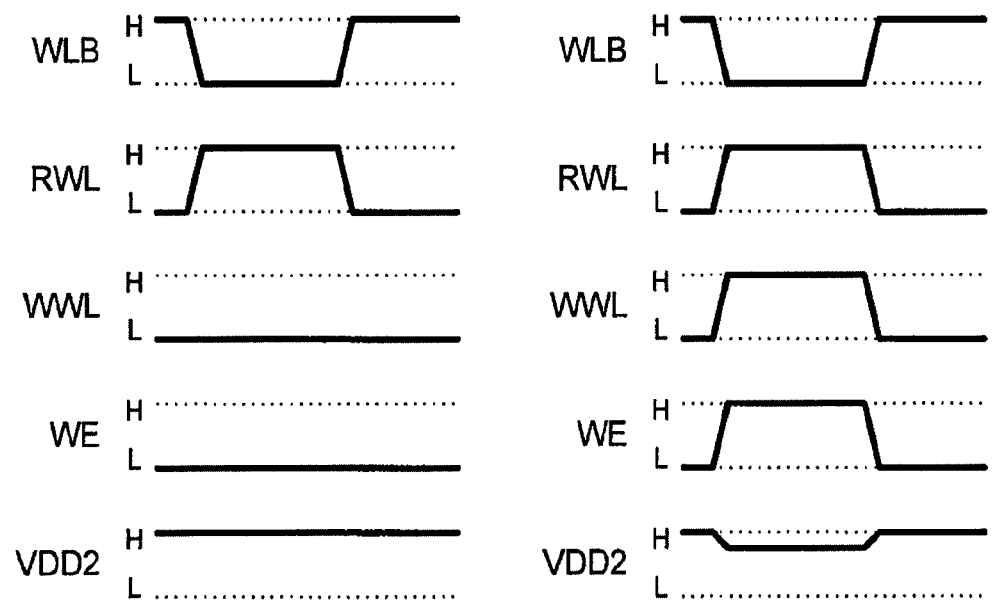

A ninth example will be described with reference to FIGS. 26A and 26B. In the ninth example, a high potential switching portion is provided between a source node VDD2 of load transistors P1 and P2 and a power source VDD for switching a high power source potential of an SRAM cell formed by seven transistors depending upon operation states. The potential switching of the node VDD2 in the SRAM cell by the high potential switching portion is implemented by connecting the node VDD2 to the power source VDD in a reading operation and in a data holding state and disconnecting the node VDD2 from the power source VDD in a writing operation so as to be in a floating state. A writing operation margin (WSNM) is enlarged by floating the high power source in the writing operation. FIG. 26A shows a circuit diagram, and FIG. 26B shows operation waveforms of signals in a reading operation and a writing operation.

The high potential switching portion shown in FIG. 26A is formed by a PMOS transistor P15. The transistor P15 has a drain, a source, and a gate connected to a node VDD2, a power source VDD, and a write enable signal WE, respectively. FIG. 26B shows operation waveforms of signals in a reading operation (leftward) and in a writing operation (rightward). The transistor P15 of the high potential switching portion is controlled by the write enable signal WE. In the data holding state or the reading operation in which the write enable signal WE has a low potential "0", the transistor P15 is in an on state. Accordingly, the potential of the node VDD2 is brought into the power source VDD. Thus, data holding and reading is conducted by a normal SRAM including seven transistors. On the other hand, in the writing operation in which the write enable signal WE has a high potential "1", the transistor P15 is in an off state. Accordingly, the node VDD2 becomes disconnected from the power source VDD.

The writing operation in a state in which the node VDD2 is disconnected from the power source VDD will be described with use of an example where "1" and "0" are written into the storage node V1 and the storage node V2, respectively, inversely from a state in which "0" and "1" are stored on the storage node V1 and the storage node V2, respectively.

The potential of the storage node V2 is to be pulled down from a high potential "1" to a low potential "0" of the write bit line WBL via the access transistor N4. However, a current is supplied from the node VDD2 to the storage node V2 via the on-state load transistor P2. Accordingly, the storage node V2 is not lowered below a certain potential. However, the transistor P15 is turned off. The node VDD2 is maintained at a high potential "1" in a floating state. Therefore, the potential of the node VDD2 is gradually lowered from the power source potential VDD by discharge to the write bit line WBL. The storage node V2 is similarly lowered. Thus, a voltage between the gate and the source of each of the load transistor P2 and the drive transistor N1 is so low, and the driving capacity is also small. Accordingly, the storage node V1 becomes likely to be inversed from "0" to "1", whereas the storage node V2 becomes likely to be inversed from "1" to "0". Thus, an operation margin is enlarged. When the writing operation is completed, the gate of the load transistor P2 has a level of "1" so that the load transistor P2 is in a complete off state. Then, the node VDD2 is returned to the power source potential by the transistor P15.

Furthermore, in an opposite case where "0" and "1" are written into the storage node V1 and the storage node V2, respectively, the holding control transistor N5 is in an off state, and no current path is formed for the storage node V2 by the drive transistor N2. Accordingly, "0" and "1" can be written into the storage node V1 and the storage node V2, respectively.

In the ninth example, the high potential switching portion is provided between the node VDD2 of the SRAM cell and the power source VDD. In order to switch the potential of the node VDD2, the high potential switching portion connects the node VDD2 to the power source VDD in the reading operation or the data holding state and disconnects the node VDD2 from the power source VDD in the writing operation. It is possible to enlarge a writing operation margin (WSNM) by disconnecting the node VDD2 from the power source VDD.

TENTH EXAMPLE

A tenth example will be described with reference to FIGS. 27A and 27B. In the tenth example, a high potential switching portion is provided between a source node VDD2 of the load transistors P1 and P2 in an SRAM cell formed by seven transistors and a power source VDD. Furthermore, a low potential switching portion is provided a source node SL1 of drive transistors N1 and N2 and a ground potential GND. In order to switch the potential of the node VDD2 in the SRAM cell, the high potential switching portion connects the node VDD2 to the power source VDD in a reading operation or a data holding state and disconnects the node VDD2 from the power source VDD in a writing operation so as to be in a floating state. In order to switch the potential of the node SL1 in the SRAM cell, the low potential switching portion brings the node SL1 into a low potential Vssm in the data holding state and bring the node SL1 into the ground potential GND in the reading operation and the writing operation.

With provision of both of the high potential switching portion and the low potential switching portion, it is possible to enlarge a writing operation margin (WSNM) and reduce a leakage current in the data holding state. FIG. 27A shows a circuit diagram, and FIG. 27B shows operation waveforms of signals in the reading operation and the writing operation.

Figure 27A:
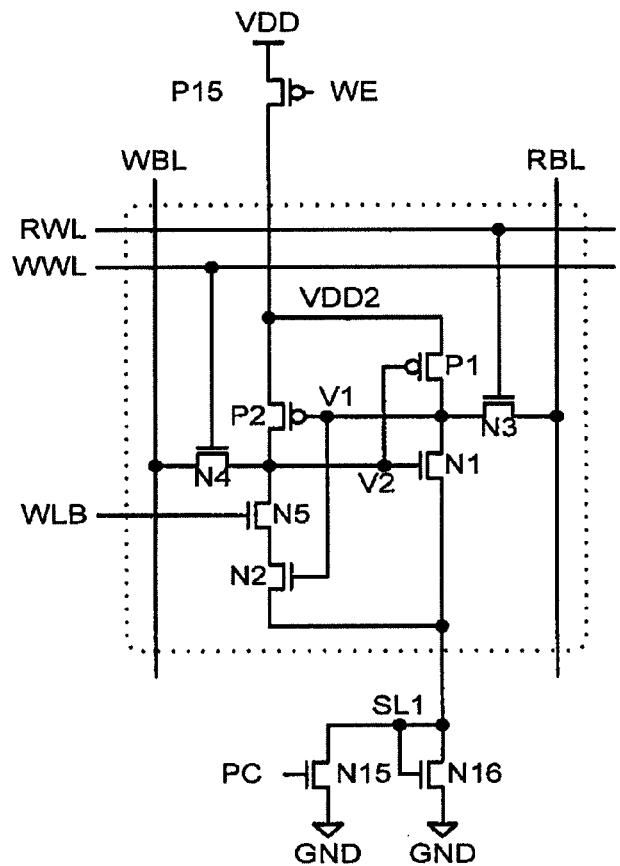
FIGS. 27A and 27B are a circuit diagram (FIG. 27A) and an operation waveform diagram (FIG. 27B) of an SRAM cell, a high potential switching portion, and a low potential switching portion in a tenth example of the present invention.

The high potential switching portion shown in FIG. 27A is the same as that in the ninth example (FIG. 26A) and is formed by a transistor P15. The transistor P15 has a drain, a source, and a gate connected to the node VDD2, the power source VDD, and a write enable signal WE, respectively. The low potential switching portion is the same as that in the fifth example (FIG. 19A) and is formed by transistors N15 and N16. The transistor N15 has a drain, a source, and a gate connected to the node SL1, the ground potential GND, and a pre-charge signal PC, respectively. The transistor N16 has a drain, a source, and a gate connected to the node SL1, the ground potential GND, and the node SL1, respectively, and is thus diode-connected.

Figure 27B:
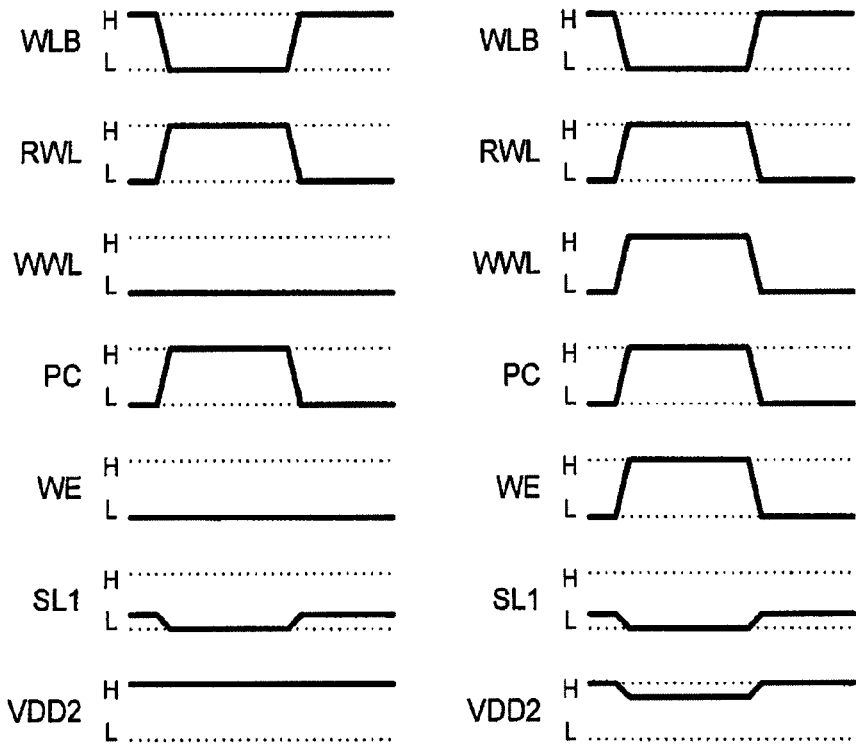

FIG. 27B shows operation waveforms of signals in a reading operation (leftward) and in a writing operation (rightward). Operations of the high potential switching portion and the low potential switching portion are the same as described in the ninth and fifth examples, respectively. In the reading operation, the write enable signal WE has a low potential "0", so that the node VDD2 is connected to the power source VDD. On the other hand, the pre-charge signal PC is brought into a high potential "1", so that the node SL1 is connected to the ground potential GND. Accordingly, a reading operation is performed in the SRAM cell formed by seven transistors connected between the power source VDD and the ground potential GND.

In the writing operation, the node VDD2 is disconnected from the power source VDD by a high potential "1" of the write enable signal WE. The node SL1 is brought into the ground potential GND by a high potential "1" of the pre-charge signal PC. Accordingly, the reading operation is performed as described in the ninth example of the seven transistors in which the node VDD2 is disconnected from the power source VDD and the low power source potential is connected to the ground potential GND. Therefore, a writing operation margin (WSNM) is enlarged.

In the data holding state, the node VDD2 is brought into the power source VDD by a low potential "0" of the write enable signal WE. The node SL1 is connected to a low potential Vssm higher than the ground potential GND by a high potential "1" of the pre-charge signal PC. Since the node SL1 is brought into the low potential Vssm, a leakage current can be reduced as with the fifth example (FIG. 19A).

In the tenth example, the high potential switching portion and the low potential switching portion are provided so as to switch the high power source potential and the low power source potential of the SRAM cell. In the reading operation, the high power source potential of the SRAM cell is brought into the power source VDD, and the low power source potential is brought into the ground potential GND. In the writing operation, the high power source potential of the SRAM cell is disconnected from the power source VDD, and the low power source potential is brought into the ground potential GND. In the data holding state, the high power source potential of the SRAM cell is brought into the power source VDD, and the low power source potential is brought into the low potential Vssm. With such a configuration, it is possible to enlarge an operation margin in the writing operation and reduce a leakage current in the data holding state.

ELEVENTH EXAMPLE

Figure 28A:
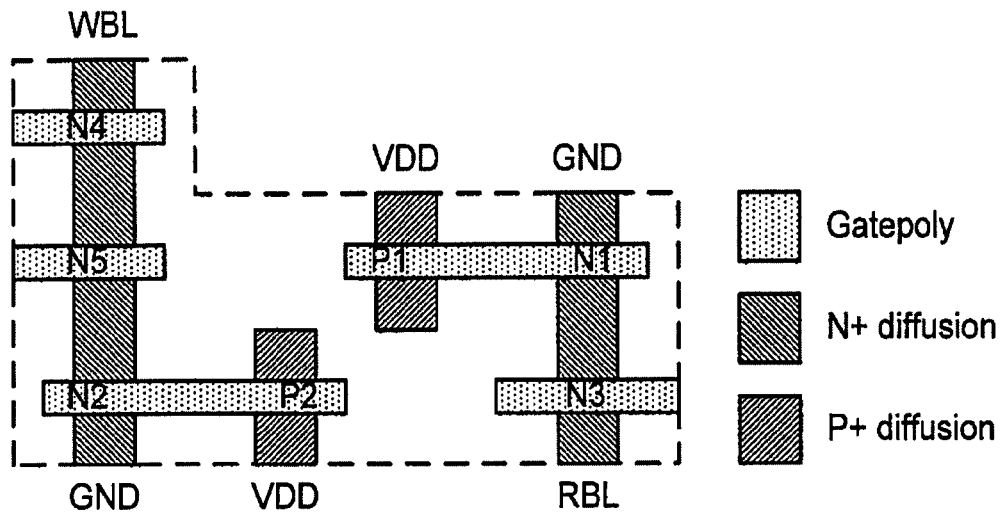
FIGS. 28A and 28B are a diagram showing a layout of a low potential switching portion (FIG. 28A) and a diagram showing a layout of a memory cell array (FIG. 28B) in an eleventh example of the present invention.
Figure 28B:
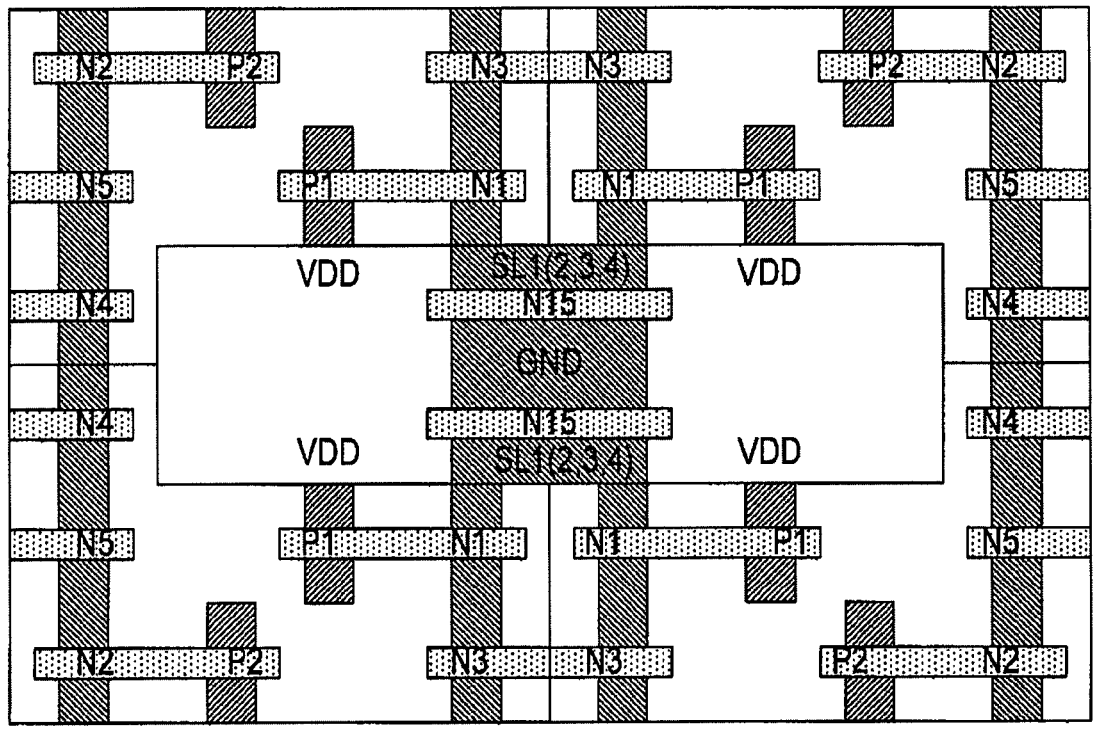
Figure 29A:
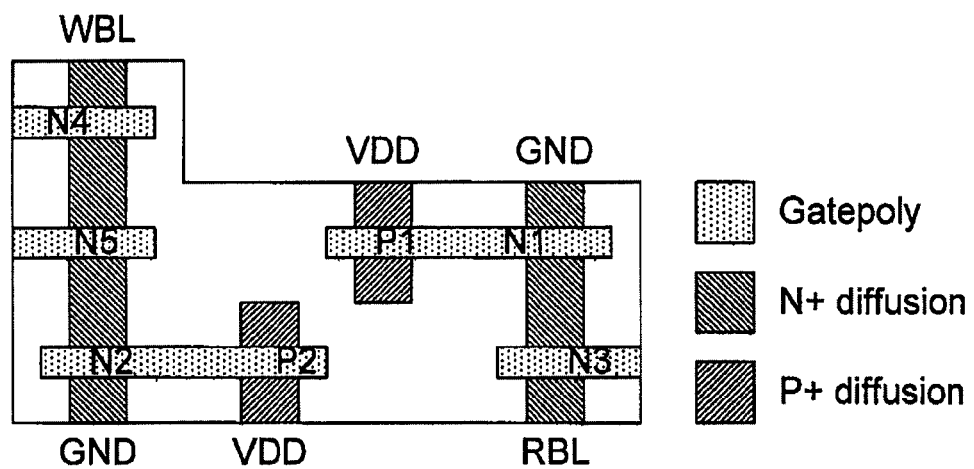
FIGS. 29A and 29B are a diagram showing a layout of a high potential switching portion (FIG. 29A) and a diagram showing a layout of a memory cell array (FIG. 29) [sic] in the eleventh example of the present invention.
Figure 29B:
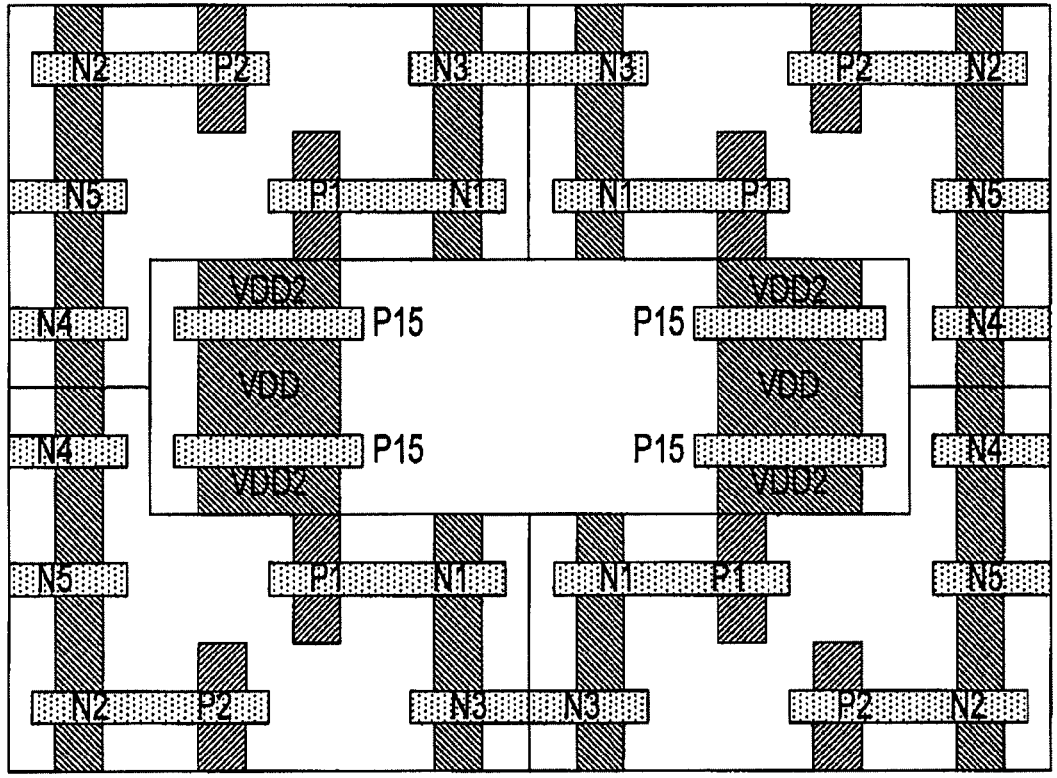

An eleventh example will be described with reference to FIGS. 28A, 28B, 29A, and 29B. In the eleventh example, a plurality of cell arrays including SRAM cells and potential switching portions are considered as a layout of a semiconductor memory device. FIG. 28A shows a layout of an SRAM cell formed by seven transistors, and FIG. 28B shows a layout of four SRAM cells and transistors N15 as low potential switching portions. FIG. 29A shows a layout of an SRAM cell formed by seven transistors, and FIG. 29B shows a layout of four SRAM cells and transistors P15 as high potential switching portions.

FIG. 28A shows a layout of an SRAM cell formed by seven transistors used in the present invention. The seven-transistor SRAM cell is formed by CMOS, and specifically by two PMOS transistors and five NMOS transistors. PMOS load transistors P1 and P2 are disposed in an N-well region at a central portion of the SRAM cell. NMOS transistors N1 and N3 on a read bit line are disposed in a rightward P-well region. NMOS transistors N2, N4, and N5 on a write bit line are disposed in a leftward P-well region. Since the number of transistors on the write bit line is larger, the layout has an L-shape as shown in FIG. 28A. Diffusion layers for a power source VDD, a ground potential GND, a read bit line RBL, and a write bit line WBL are formed at a boundary of the SRAM cell so that the SRAM cell can be connected in common to an adjacent SRAM cell.

In the layout shown in FIG. 28B, four L-shaped SRAM cells are disposed so as to be reversed with a mirror, and transistors N15 are disposed as low potential switching portions according to the present invention at a central portion of the SRAM cells. When the SRAM cells are reversed with a mirror, diffusion layers can be formed in a central space for the power source VDD and the ground potential GND. Of transistors as low potential switching portions, transistors required to have a driving capacity are disposed in the central space. Two transistors N15 are disposed because the transistors N15 are required to have a driving capacity. Diffusion layers for the power source at the central portion of the four SRAM cells are used as the node SL1 (or SL2, SL3, SL4), and the transistors N15 are formed. Furthermore, a common ground potential GND is formed.

FIG. 29A shows an SRAM cell. In the layout shown FIG. 29B, four L-shaped SRAM cells are disposed so as to be reversed with a mirror, and four PMOS transistor P15 are disposed as high potential switching portions. Diffusion layers for the power source at a central portion of the four SRAM cells are used as the node VDD2, and the transistors P15 are formed. Furthermore, a common power source VDD is formed. When the low potential switching portion and the high potential switching portion are used as in the tenth example, both transistors as high potential switching portions and transistors as low potential switching portions may be disposed.

In this example, the SRAM cell formed by seven transistors has an L-shaped cell arrangement, and the transistors as the potential switching portions are disposed at the central space of the cell array in which the SRAM cells are reversed with a mirror. Accordingly, it is possible to form a layout having a good space efficiency and obtain an inexpensive semiconductor memory device.

Although the present invention has been described in detail based upon a plurality of examples, any of the plurality of examples can be combined with each other. For example, when the first example and the fifth example are combined with each other, it is possible to improve the stability in a reading operation and reduce a leakage current. Furthermore, the present invention may be combined with any arrangement disclosed by the prior applications of the inventors (Japanese patent application No. 2003-365436, PCT/JP2004-014035). For example, a layout of sense amplifiers and memory cells disclosed by the aforementioned prior applications or the like may be used for the arrangement of the present invention.

The present invention is not limited to the aforementioned examples. As a matter of course, various changes may be made therein without departing from the spirit of the present invention.

The invention claimed is:

1. A semiconductor memory device including a memory cell, characterized in that:
   the memory cell is a semiconductor memory device having first and second data storage nodes and includes:
   a first inverter circuit using the second data storage node as an input and using the first data storage node as an output;
   a second inverter circuit using the first data storage node as an input and using the second data storage node as an output;
   first access means connected to the first data storage node for reading and writing data;
   second access means connected to the second data storage node for writing data; and
   holding control means connected in series with a drive transistor of the second inverter circuit, and
   the memory cell is operable to switch a low power source potential of at least one of the first and second inverter circuits.

2. The semiconductor memory device as recited in claim 1, characterized in that the memory cell has means for switching the low power source potential of the first inverter circuit.

3. The semiconductor memory device as recited in claim 2, characterized in that the memory cell is operable to switch the low power source potential of the first inverter circuit by a low potential switching portion provided between the low power source potential of the first inverter circuit and a ground potential.

4. The semiconductor memory device as recited in claim 3, characterized in that the low potential switching portion is operable to bring the low power source potential into a floating state in a writing operation of the memory cell.

5. The semiconductor memory device as recited in claim 3, characterized in that the low potential switching portion is operable to bring the low power source potential into a low potential higher than the ground potential in a writing operation of the memory cell and bring the low power source potential into the ground potential in a reading operation of the memory cell and in a data holding state.

6. The semiconductor memory device as recited in claim 3, characterized in that the low potential switching portion comprises a transistor connected between the low power source potential of the first inverter circuit and the ground potential with a gate electrode to which an inverse write signal is inputted.

7. The semiconductor memory device as recited in claim 3, characterized in that the low potential switching portion comprises a first transistor connected between the low power source potential of the first inverter circuit and the ground potential with a gate electrode connected to a high power source potential and a second transistor connected between the low power source potential of the first inverter circuit and the high power source potential with a gate electrode to which an inverse write signal is inputted.

8. The semiconductor memory device as recited in claim 3, characterized in that the low potential switching portion comprises a first transistor connected between the low power source potential of the first inverter circuit and the ground potential with a gate electrode connected to a high power source potential and a second transistor connected between the low power source potential of the first inverter circuit and the high power source potential with a gate electrode to which a write signal is inputted.

9. The semiconductor memory device as recited in claim 1, characterized in that the memory cell has means for switching the low power source potential of the first and second inverter circuits.

10. The semiconductor memory device as recited in claim 9, characterized in that the memory cell is operable to switch the low power source potential of the first and second inverter circuits by a low potential switching portion provided between the low power source potential of the first and second inverter circuits and a ground potential.

11. The semiconductor memory device as recited in claim 10, characterized in that the low potential switching portion is operable to bring the low power source potential into the ground potential in reading and writing operations of the memory cell and bring the low power source potential into a low potential higher than the ground potential in a data holding state.

12. The semiconductor memory device as recited in claim 10, characterized in that the low potential switching portion is operable to bring the low power source potential into the ground potential in a reading operation of the memory cell and bring the low power source potential into a low potential higher than the ground potential in a writing operation of the memory cell and in a data holding state.

13. The semiconductor memory device as recited in claim 10, characterized in that the low potential switching portion comprises a first transistor connected between the low power source potential of the first and second inverter circuits and the ground potential with a gate electrode connected to a pre-charge signal and a second transistor having a gate electrode connected to the low power source potential.

14. The semiconductor memory device as recited in claim 10, characterized in that the low potential switching portion comprises a first transistor connected between the low power source potential of the first and second inverter circuits and the ground potential with a gate electrode connected to a read enable signal and a second transistor having a gate electrode connected to the low power source potential.

15. The semiconductor memory device as recited in claim 10, characterized in that the low potential switching portion comprises a first transistor connected between the low power source potential of the first and second inverter circuits and the ground potential with a gate electrode connected to a pre-charge signal, a second transistor having a gate electrode connected to the low power source potential, and a third transistor connected between the low power source potential of the first and second inverter circuits and a high power source potential with a gate electrode connected to a write enable signal.

16. The semiconductor memory device as recited in claim 9, characterized in that the low potential switching portion comprises a first transistor connected between the low power source potential of the first and second inverter circuits and the ground potential with a gate electrode connected to a pre-charge signal, a second transistor having a gate electrode connected to the low power source potential, and a third transistor connected between the low power source potential of the first and second inverter circuits and a high power source potential with a gate electrode connected to an inverse write enable signal.

17. A semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
first access means connected to the first data storage node for reading and writing data;
second access means connected to the second data storage node for writing data; and
holding control means connected in series with a drive transistor of the second inverter circuit, and
the memory cell further has means for switching a high power source potential of the first and second inverter circuits.

18. The semiconductor memory device as recited in claim 17, characterized in that the means for switching the high power source potential is a high potential switching portion provided between the high power source potential and a power source.

19. The semiconductor memory device as recited in claim 18, characterized in that the high potential switching portion is operable to bring the high power source potential of the first and second inverter circuits into a floating state in a writing operation of the memory cell.

20. The semiconductor memory device as recited in claim 17, characterized in that the memory cell is operable to switch a low power source potential of the first and second inverter circuits by a low potential switching portion provided between the low power source potential of the first and second inverter circuits and a ground potential.

21. The semiconductor memory device as recited in claim 17, characterized in that the high potential switching portion comprises a first transistor connected between the high power source potential of the first and second inverter circuits and a power source with a gate electrode connected to a write enable signal.

22. A semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
first access means connected to the first data storage node for reading and writing data;
second access means connected to the second data storage node for writing data;
holding control means connected in series with a drive transistor of the second inverter circuit; and
a replica memory cell, and
the memory cell is controlled by a control signal having a pulse width equal to a period of time required for reading of the replica memory cell.

23. The semiconductor memory device as recited in claim 22, characterized in that the holding control means is operable to bring the drive transistor of the second inverter circuit out of conduction in a reading operation of the memory cell by the control signal.

24. The semiconductor memory device as recited in claim 22, characterized in that a read word line signal is generated by the control signal, and the read word line signal has an activation pulse width equal to the pulse width of the control signal.

25. A semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
a first access transistor connected to the first data storage node for reading and writing data;
a second access transistor connected to the second data storage node for writing data; and
a holding control transistor connected in series with a drive transistor of the second inverter circuit, and
a leakage current of the holding control transistor or a leakage current of the second access transistor is increased in a reading operation of the memory cell.

26. The semiconductor memory device as recited in claim 25, characterized in that the leakage current is increased by bringing a low potential inputted to the holding control transistor or the second access transistor into a potential higher than a ground potential in the reading operation of the memory cell.

27. A semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
first access means connected to the first data storage node for reading and writing data;
second access means connected to the second data storage node for writing data;
holding control means connected in series with a drive transistor of the second inverter circuit; and
a replica memory cell.

28. The semiconductor memory device as recited in claim 27, characterized in that a plurality of replica memory cells are used and multiplexed.

29. A driving method of a semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
a first access transistor connected to the first data storage node for reading and writing data;
a second access transistor connected to the second data storage node for writing data; and
a holding control transistor connected in series with a drive transistor of the second inverter circuit, and
an off time of the holding control transistor is controlled depending upon a relationship between a sum of an off-state leakage current of the second access transistor and an off-state leakage current of the holding control transistor, and an off-state leakage current of a load transistor of the second inverter circuit.

30. A driving method of a semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
a first access transistor connected to the first data storage node for reading and writing data;
a second access transistor connected to the second data storage node for writing data; and
a holding control transistor connected in series with a drive transistor of the second inverter circuit, and
an off-state leakage current of the second access transistor or an off-state leakage current of the drive transistor of the second inverter circuit is controlled.

31. A semiconductor memory device including a memory cell, characterized in that:
the memory cell is a semiconductor memory device having first and second data storage nodes and includes:
a first inverter circuit using the second data storage node as an input and using the first data storage node as an output;
a second inverter circuit using the first data storage node as an input and using the second data storage node as an output;
a first access transistor connected to the first data storage node for reading and writing data;
a second access transistor connected to the second data storage node for writing data; and
a holding control transistor connected in series with a drive transistor of the second inverter circuit, and
the memory cell further has a second transistor provided between a low power source potential of the first inverter circuit and a ground potential with a gate electrode to which an inverse write signal is inputted.

32. A driving method of a semiconductor memory device comprising a memory cell having:
a first inverter circuit using a second data storage node as an input and using a first data storage node as an output;
a second inverter circuit using the first data storage node as an input and using the second data storage node as an output;
a first access transistor connected to the first data storage node for reading and writing data;
a second access transistor connected to the second data storage node for writing data; and
a holding control transistor connected in series with a drive transistor of the second inverter circuit, the driving method characterized in that:
the memory cell is operable to switch a low power source potential of at least one of the first and second inverter circuits in a writing operation of the memory cell.

33. The driving method of a semiconductor memory device as recited in claim 32, characterized in that the memory cell is operable to bring the low power source potential of the first inverter circuit into a floating state in the writing operation of the memory cell.

34. A semiconductor memory device including a memory cell, characterized in that:
  the memory cell is a semiconductor memory device having first and second data storage nodes and includes:
  a first inverter circuit using the second data storage node as an input and using the first data storage node as an output;
  a second inverter circuit using the first data storage node as an input and using the second data storage node as an output;
  first access means connected to the first data storage node for reading and writing data;
  second access means connected to the second data storage node for writing data; and
  holding control means connected in series with a drive transistor of the second inverter circuit, and
  the memory cell is operable to bring a low power source potential of the first and second inverter circuits into a ground potential in reading and writing operations of the memory cell and bring it into a low potential higher than the ground potential in a data holding state.

* * * * *

UNITED STATES PATENT AND TRADEMARK OFFICE
CERTIFICATE OF CORRECTION

| | | |
|---|---|---|
| PATENT NO. | : 7,826,253 B2 | Page 1 of 1 |
| APPLICATION NO. | : 11/815415 | |
| DATED | : November 2, 2010 | |
| INVENTOR(S) | : Koichi Takeda | |

It is certified that error appears in the above-identified patent and that said Letters Patent is hereby corrected as shown below:

Column 20, Line 48: Delete "N11" and insert -- N15 --

Signed and Sealed this
Eleventh Day of January, 2011

David J. Kappos
*Director of the United States Patent and Trademark Office*